United States Patent
Ho et al.

(10) Patent No.: US 12,218,129 B2
(45) Date of Patent: Feb. 4, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Yi-Chen Ho, Taichung (TW); Hung Chih Hu, Taichung (TW); Hung Cheng Yu, Hsinchu (TW); Ju Ru Hsieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 256 days.

(21) Appl. No.: 17/855,506

(22) Filed: Jun. 30, 2022

(65) Prior Publication Data
US 2022/0336450 A1    Oct. 20, 2022

Related U.S. Application Data

(62) Division of application No. 16/803,965, filed on Feb. 27, 2020, now Pat. No. 11,721,694.

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823431* (2013.01); *H01L 21/823878* (2013.01);
(Continued)

(58) Field of Classification Search
CPC ..... H01L 21/823431; H01L 21/823481; H01L 21/823878; H01L 29/785; H01L 29/0649; H01L 27/0886
See application file for complete search history.

(56) References Cited

U.S. PATENT DOCUMENTS 9,461,043 B1    10/2016 Chang et al.
9,659,930 B1     5/2017 Yu et al.
(Continued)

FOREIGN PATENT DOCUMENTS

DE    102016115984 A1    5/2017
KR    10-2017-0052433 A    5/2017
(Continued)

OTHER PUBLICATIONS

Non-Final Office Action issued in U.S. Appl. No. 16/803,465, dated Jun. 18, 2021.
(Continued)

*Primary Examiner* — Tuan A Hoang
(74) *Attorney, Agent, or Firm* — STUDEBAKER & BRACKETT PC

(57) ABSTRACT

A semiconductor device including fin field-effect transistors, includes a first gate structure extending in a first direction, a second gate structure extending the first direction and aligned with the first gate structure in the first direction, a third gate structure extending in the first direction and arranged in parallel with the first gate structure in a second direction crossing the first direction, a fourth gate structure extending the first direction, aligned with the third gate structure and arranged in parallel with the second gate structure, an interlayer dielectric layer disposed between the first to fourth gate electrodes, and a separation wall made of different material than the interlayer dielectric layer and disposed between the first and third gate structures and the second and fourth gate structures.

20 Claims, 28 Drawing Sheets

(51) Int. Cl.
*H01L 21/8238* (2006.01)
*H01L 29/66* (2006.01)
*H01L 29/78* (2006.01)
*H01L 29/06* (2006.01)

(52) U.S. Cl.
CPC .. *H01L 29/66545* (2013.01); *H01L 29/66795* (2013.01); *H01L 29/785* (2013.01); *H01L 29/0649* (2013.01)

(56) References Cited

U.S. PATENT DOCUMENTS

| | | | |
|---|---|---|---|
| 10,026,737 | B1 | 7/2018 | Ching et al. |
| 10,029,802 | B2 | 7/2018 | Williams |
| 10,038,079 | B1 | 7/2018 | Ohtou et al. |
| 10,269,787 | B2 | 4/2019 | Wang et al. |
| 2014/0225116 | A1* | 8/2014 | Ramkumar ....... H01L 29/40117 257/66 |
| 2016/0133632 | A1* | 5/2016 | Park ................. H01L 29/66545 257/369 |
| 2016/0225764 | A1 | 8/2016 | Chang et al. |
| 2017/0125411 | A1* | 5/2017 | Yu ................... H01L 21/823431 |
| 2018/0190652 | A1 | 7/2018 | Ching et al. |
| 2018/0277440 | A1 | 9/2018 | Yu et al. |
| 2019/0006345 | A1* | 1/2019 | Wang ................ H01L 21/32139 |
| 2019/0067417 | A1 | 2/2019 | Ching et al. |
| 2019/0139831 | A1 | 5/2019 | Zhu |
| 2019/0206867 | A1* | 7/2019 | Lee ................. H01L 21/823864 |
| 2019/0341448 | A1 | 11/2019 | Bourjot et al. |
| 2020/0002617 | A1 | 1/2020 | Schons et al. |
| 2020/0006354 | A1 | 1/2020 | Wen et al. |
| 2020/0044070 | A1 | 2/2020 | Wang et al. |

FOREIGN PATENT DOCUMENTS

| | | |
|---|---|---|
| KR | 10-2017-0095174 A | 8/2017 |
| KR | 10-2018-0079160 A | 7/2018 |
| KR | 10-2019-0002301 A | 1/2019 |
| KR | 10-2020-0002617 A | 1/2020 |
| TW | 567944 B | 1/2017 |
| TW | 669818 B | 8/2019 |
| TW | 202006928 A | 2/2020 |

OTHER PUBLICATIONS

Final Office Action issued in U.S. Appl. No. 16/803,465, dated Dec. 2, 2021.

Non-Final Office Action issued in U.S. Appl. No. 16/803,465, dated Apr. 27, 2022.

* cited by examiner

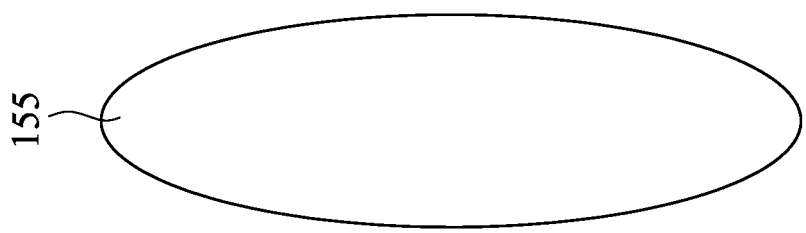
FIG. 11E
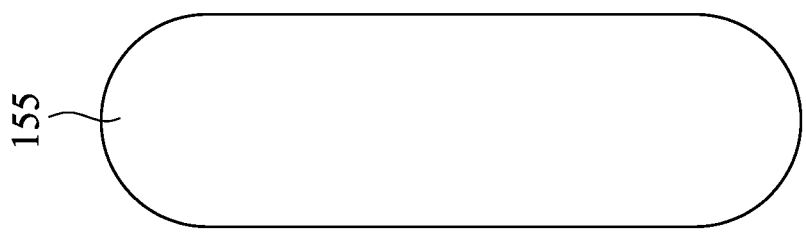
FIG. 11D
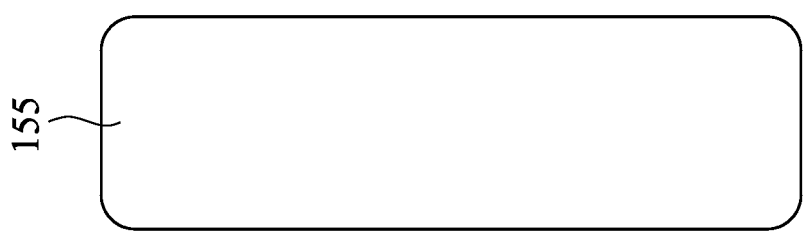
FIG. 11C
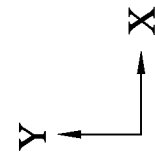

SEMICONDUCTOR DEVICE AND MANUFACTURING METHOD THEREOF

RELATED APPLICATIONS

This application is divisional of U.S. patent application Ser. No. 16/803,965 filed Feb. 27, 2020, now U.S. Pat. No. 11,721,694, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structures (e.g., wrapping) utilizing the advantage of the increased surface area of the channel and source/drain regions to produce faster, more reliable and better-controlled semiconductor transistor devices. A metal gate structure together with a high-k gate dielectric having a high electric dielectric constant is often used in Fin FET device, and is fabricated by a gate-replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 11C, 11D and 11E show structures of a separation wall according to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain.

FIGS. 1-10D show cross sectional and/or plan views of a sequential manufacturing process of a semiconductor device, such as an FET, according to one embodiment of the present disclosure. It is understood that additional operations can be provided before, during, and after processes shown by FIGS. 1-10D, and some of the operations described below can be replaced or eliminated, for additional embodiments of the method. The order of the operations/processes may be interchangeable.

Figure 1:
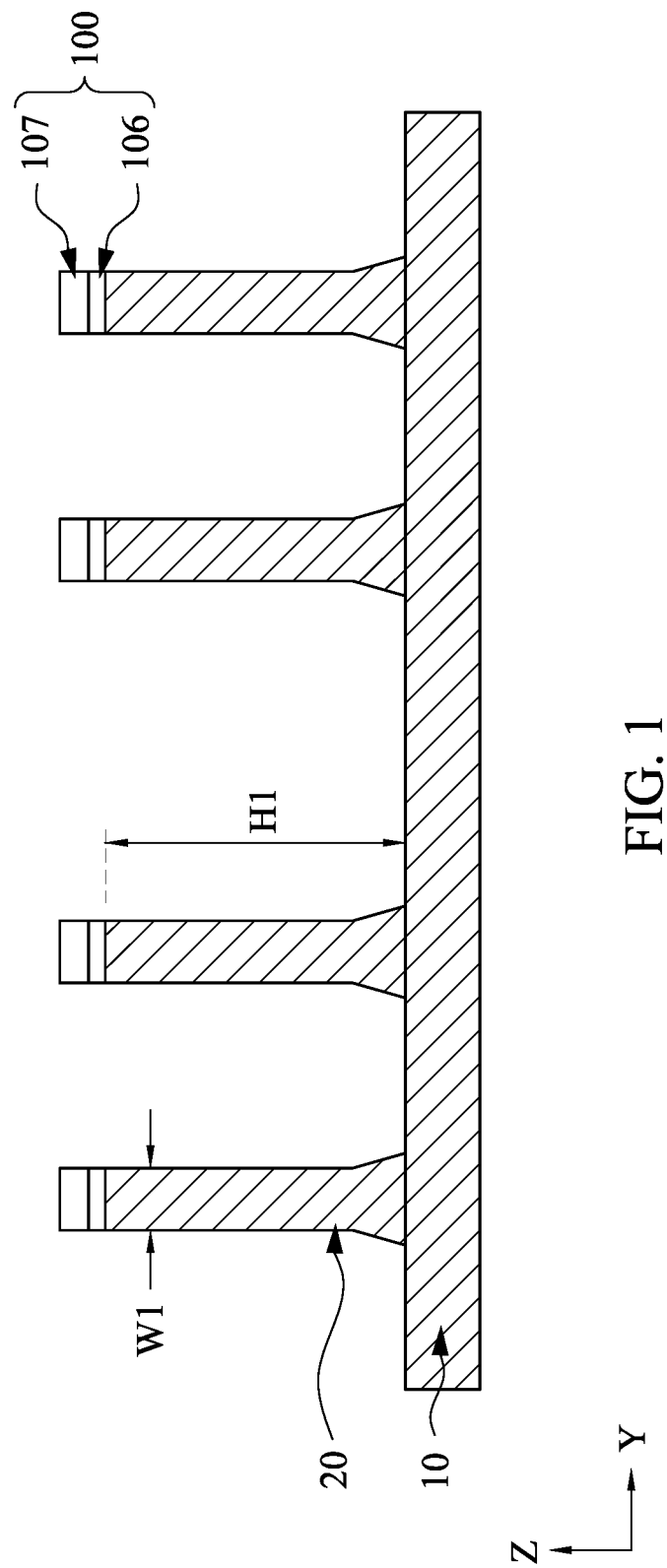
FIG. 1 shows a cross sectional view of one of the various stages of a sequential process for manufacturing an FET device according to an embodiment of the present disclosure.

FIG. 1 shows a cross sectional view in which fin structures 20 are formed over a substrate 10 according to some embodiments of the present disclosure.

The substrate 10 is, for example, a p-type silicon substrate with an impurity concentration being in a range from about $1\times10^{15}$ cm$^{-3}$ and about $5\times10^{15}$ cm$^3$. In other embodiments, The substrate is an n-type silicon substrate with an impurity concentration being in a range from about $1\times10^{15}$ cm$^{-3}$ and about $5\times10^{15}$ cm$^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structures 20 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures. In some embodiments, the remaining spacers are used to pattern a hard mask layer 100 and the substrate is patterned by using the patterned hard mask layer 100.

The hard mask layer 100 includes, for example, a pad oxide (e.g., silicon oxide) layer 106 and a silicon nitride mask layer 107 in some embodiments. The pad oxide layer 106 may be formed by using thermal oxidation or a CVD process. The silicon nitride mask layer 107 may be formed by a physical vapor deposition (PVD), such as sputtering method; a CVD, such as plasma-enhanced chemical vapor deposition (PECVD), an atmospheric pressure chemical vapor deposition (APCVD), a low-pressure CVD (LPCVD), and a high density plasma CVD (HDPCVD); an atomic layer deposition (ALD), and/or other processes.

The thickness of the pad oxide layer 106 is in a range from about 2 nm to about 15 nm and the thickness of the silicon nitride mask layer 107 is in a range from about 2 nm to about 50 nm in some embodiments. By using the hard mask pattern 100 as an etching mask, the substrate 10 is patterned into fin structures 20 by trench etching using a dry etching method and/or a wet etching method.

The fin structures 20 disposed over the substrate 10 are made of the same material as the substrate 10 and continuously extend from the substrate 10 in one embodiment. The fin structures 20 may be intrinsic, or appropriately doped with an n-type impurity or a p-type impurity.

In FIG. 1, four fin structures 20 are disposed. These fin structures are used for a p-type Fin FET and/or an n-type Fin FET. The number of the fin structures 20 is not limited to four. The numbers may be as small as one, or more than four. In addition, one or more dummy fin structures are disposed adjacent both sides of the fin structures 20 to improve pattern fidelity in patterning processes in some embodiments. The width W1 of the fin structures 20 is in a range from about 5 nm to about 40 nm in some embodiments, and is in a range from about 7 nm to about 20 nm in certain embodiments. The height H1 of the fin structures 20 is in a range from about 100 nm to about 300 nm in some embodiments, and is a range of about 50 nm to 100 nm in other embodiments. When the heights of the fin structures 20 are not uniform, the height from the substrate may be measured from the plane that corresponds to the average heights of the fin structures.

Figure 2:
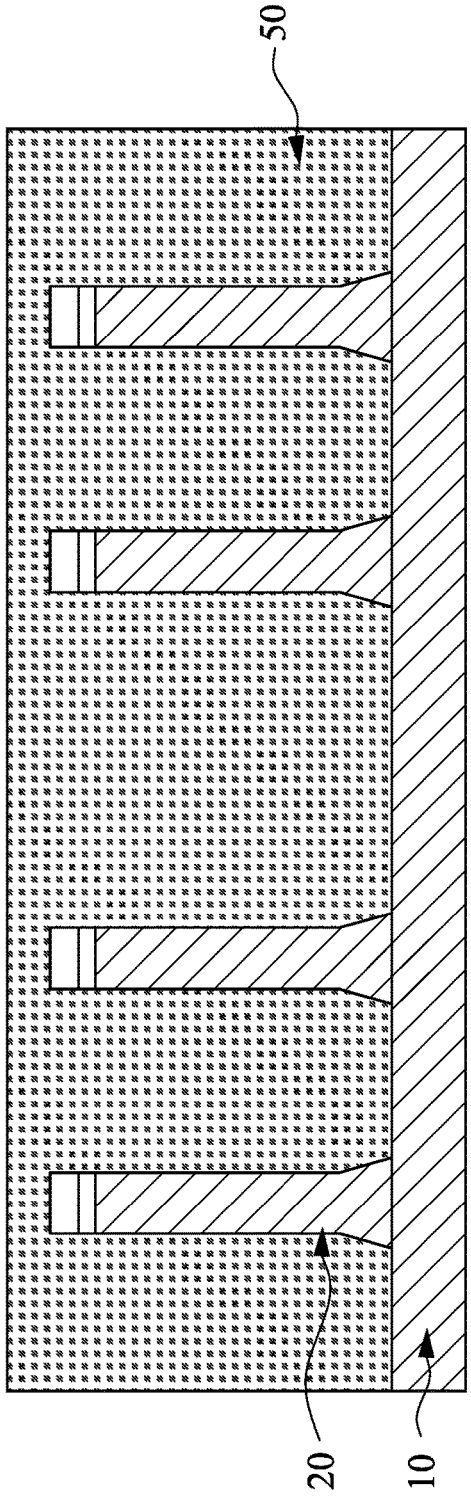
FIG. 2 shows a cross sectional view of one of the various stages of a sequential process for manufacturing an FET device according to an embodiment of the present disclosure.

Then, as shown in FIG. 2, an insulating material layer 50 to form an isolation insulating layer is formed over the substrate 10 so as to fully cover the fin structures 20.

The insulating material for the isolation insulating layer 50 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The isolation insulating layer 50 may be SOG, SiO, SiON, SiOCN or fluorine-doped silicate glass (FSG). The isolation insulating layer 50 may be doped with boron and/or phosphorous.

Figure 3:
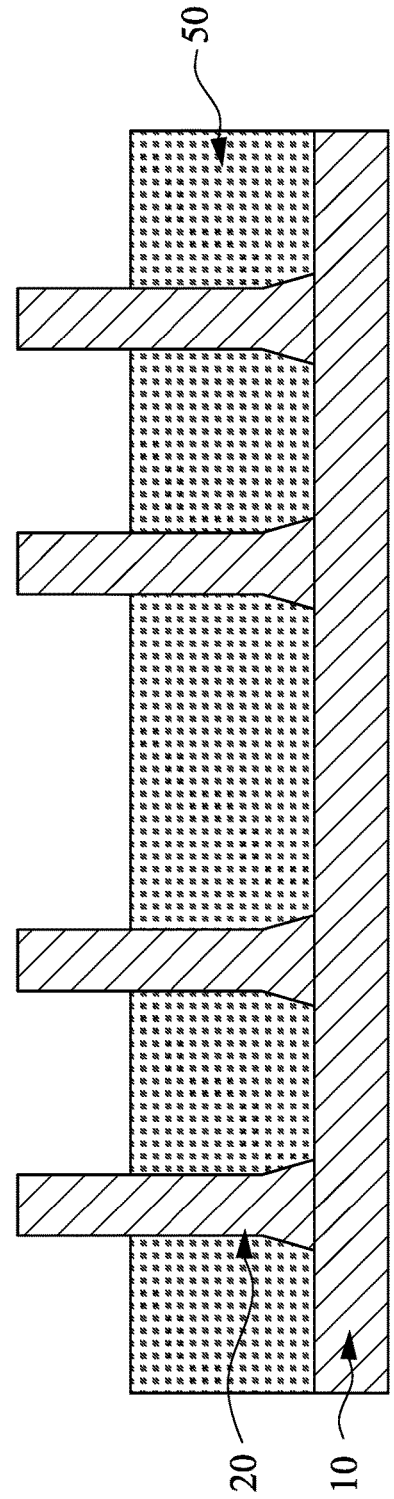
FIG. 3 shows a cross sectional view of one of the various stages of a sequential process for manufacturing an FET device according to an embodiment of the present disclosure.

After forming the isolation insulating layer 50, a planarization operation is performed so as to remove upper part of the isolation insulating layer 50 and the mask layer 100 including the pad oxide layer 106 and the silicon nitride mask layer 107. Then, the isolation insulating layer 50 is further removed so that an upper part of the fin structures 20, which is to become a channel region, is exposed, as shown in FIG. 3.

After forming the isolation insulating layer 50, a thermal process, for example, an anneal process, is optionally performed to improve the quality of the isolation insulating layer 50. In certain embodiments, the thermal process is performed by using rapid thermal annealing (RTA) at a temperature in a range from about 900° C. to about 1050° C. for about 1.5 seconds to about 10 seconds in inert gas ambient, for example, $N_2$, Ar or He ambient.

After the upper portions of the fin structures 20 are exposed from the isolation insulating layer 50, a sacrificial gate insulating layer 105 and a poly silicon layer are formed over the isolation insulating layer 50 and the exposed fin structures 20, and then patterning operations are performed so as to obtain a sacrificial gate layer 110 made of poly silicon, as shown in FIGS. 4A-4D. The sacrificial gate insulating layer 105 may be silicon oxide formed by CVD, PVD, ALD, e-beam evaporation, or other suitable process. A thickness of the poly silicon layer is in a range from about 5 to about 100 nm in some embodiments. In the gate replacement technology described with FIGS. 9A-10D, the sacrificial gate insulating layer 105 and the sacrificial gate layer 110 are both dummy layers which are subsequently removed.

After the patterning the poly silicon layer, sidewall insulating layers 80 (gate sidewall spacers) are also formed at both side faces of the sacrificial gate layer 110. The sidewall insulating layers 80 are made of one or more layers of silicon oxide or silicon nitride based materials such as SiN, SiCN, SiON or SiOCN. In one embodiment, silicon nitride is used.

After the sidewall insulating layers 80 are formed, an insulating layer 90 to be used as a contact-etch stop layer (CESL) is formed over the poly silicon layer 110 and the sidewall insulating layer 80, in some embodiments. The CESL layer 90 is made of one or more layers of silicon oxide or silicon nitride based materials such as SiN, SiCN, SiON or SiOCN. In one embodiment, silicon nitride is used.

Further, an interlayer dielectric layer (ILD) 70 is formed in spaces between the sacrificial gate layers 110 with the side-wall insulating layers 80 and the CESL 90 and over the sacrificial gate layer 110. The ILD layer 70 may include silicon oxide, silicon nitride, silicon oxynitride (SiON), SiOCN, fluorine-doped silicate glass (FSG), or a low-k dielectric material, and may be made of CVD or other suitable process. The insulating material for the isolation insulating layer 50 may be the same as or different from that for the ILD layer 70.

Figure 4A:
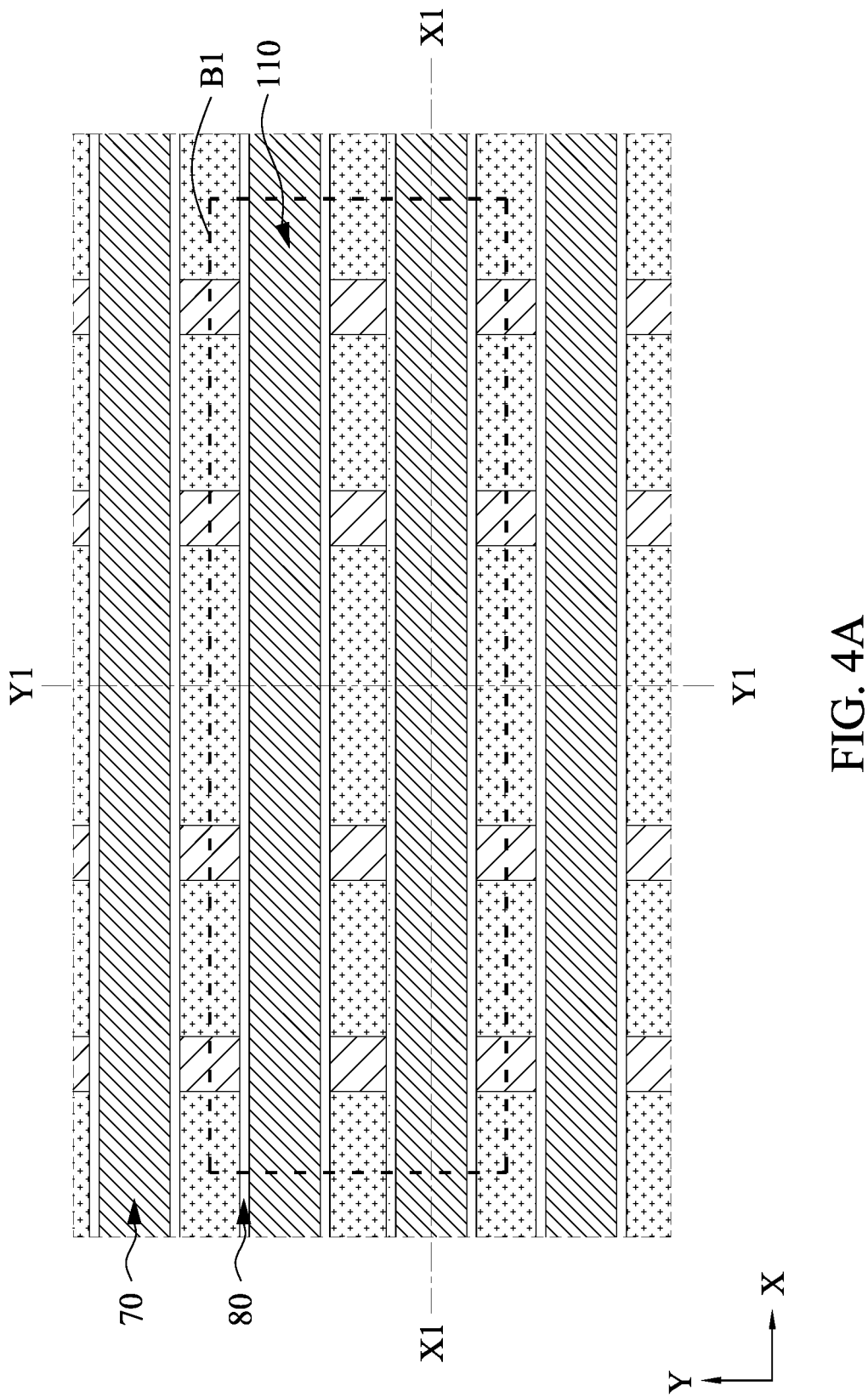
FIGS. 4A, 4B, 4C and 4D show various views of one of the various stages of a sequential process for manufacturing an FET device according to an embodiment of the present disclosure.
Figure 4B:
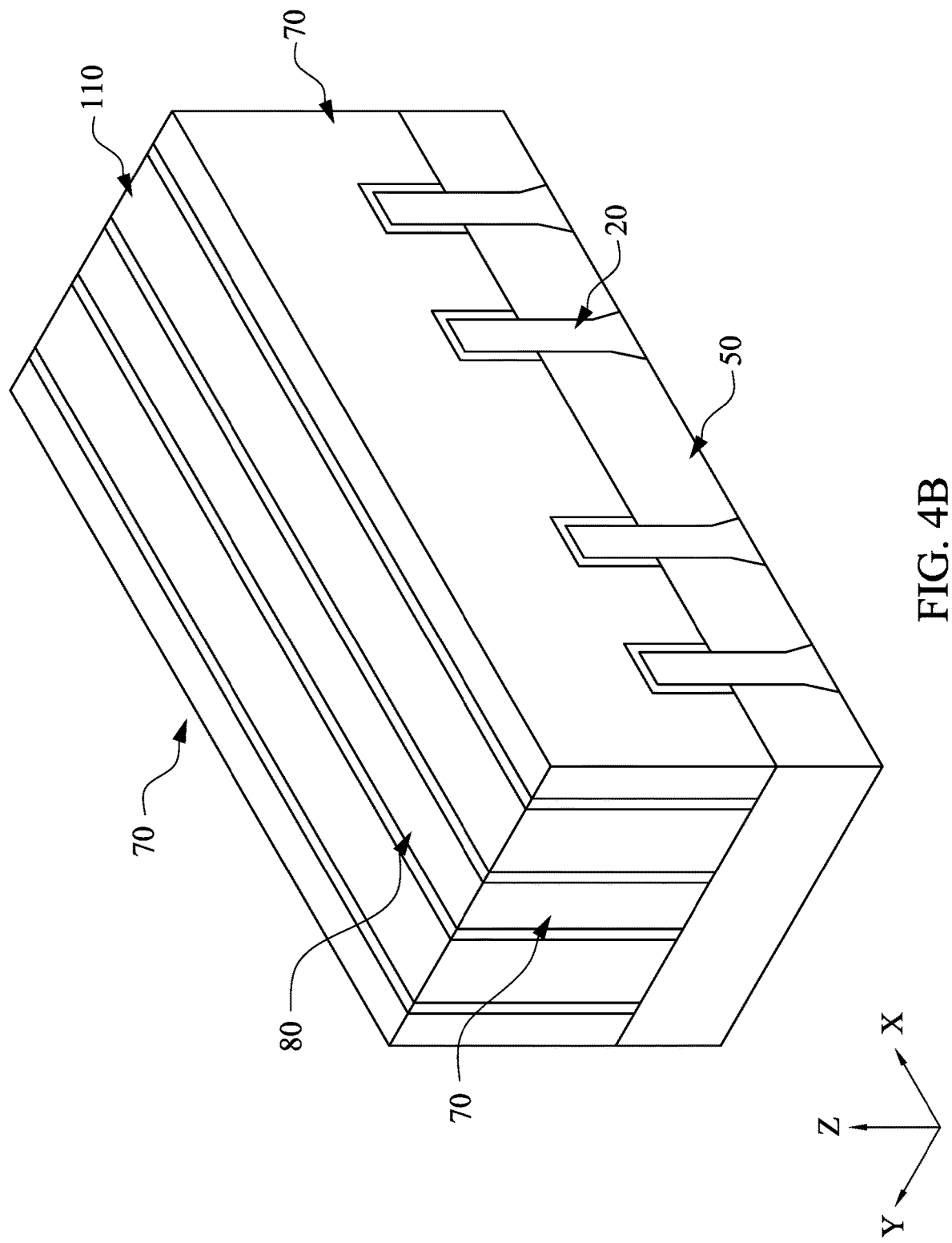
Figure 4C:
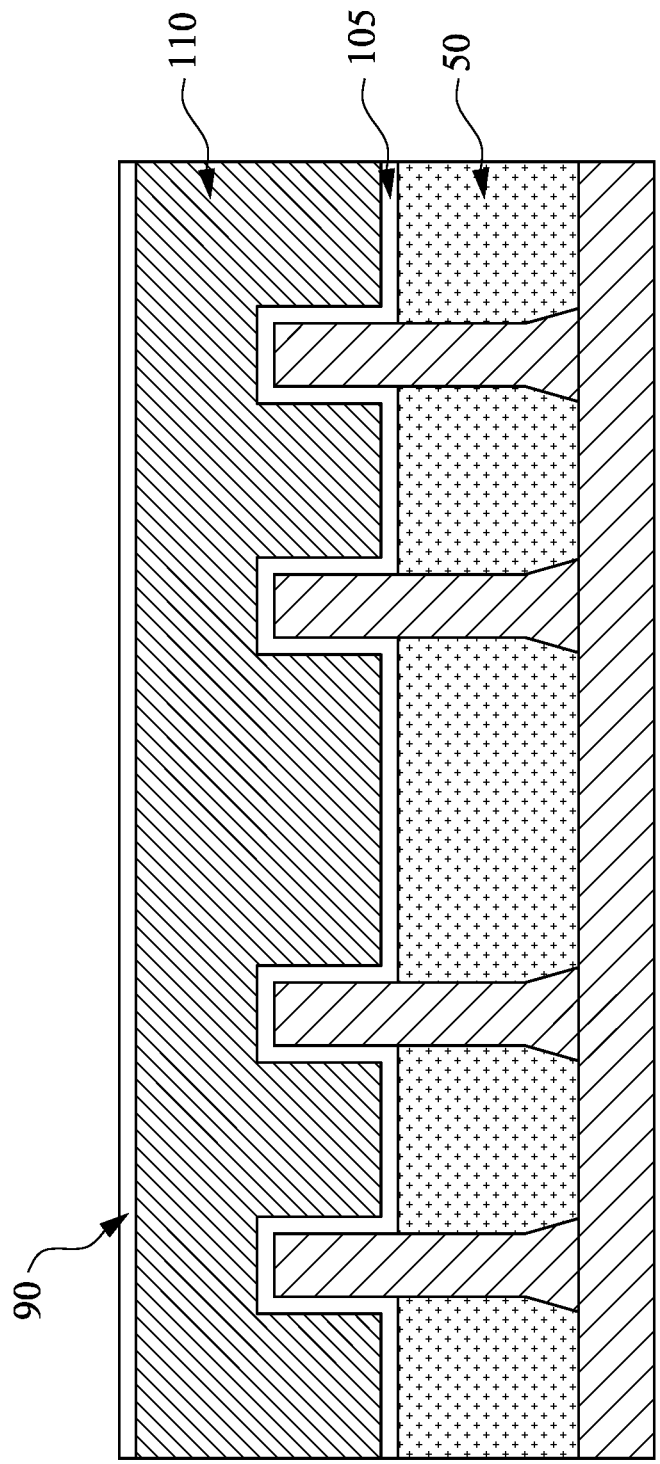
Figure 4D:
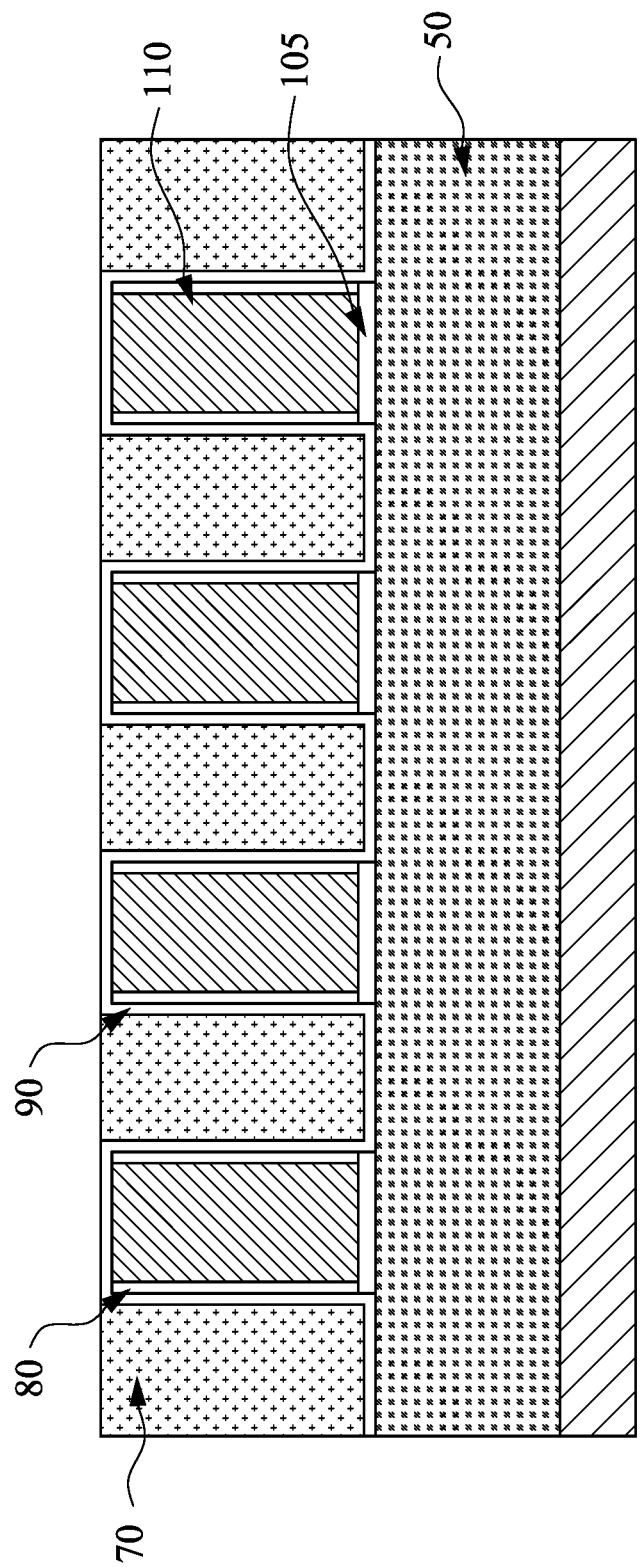

Planarization operations, such as an etch-back process and/or a chemical mechanical polishing (CMP) process, are performed, so as to obtain the structure shown in FIGS. 4A-4D. FIG. 4A is a plan view (top view) and FIG. 4B is a perspective view of the Fin FET device after the sacrificial gate layer 110 and the interlayer dielectric layer 70 are formed and the CMP operation is performed. FIGS. 1-3 and 4C correspond to cross sectional views along line X1-X1 in FIG. 4A, FIG. 4D correspond to a cross sectional view along line Y1-Y1 in FIG. 4A, and FIG. 4B corresponds to the enclosed portion B1 in FIG. 4A. In FIGS. 4A and 4B, a CESL 90 is omitted.

As shown in FIGS. 4A and 4B, the sacrificial gate layers 110 are formed in a line-and-space arrangement extending in one direction (X direction) with a constant pitch. The sacrificial gate layers 110 may include another line-and-space arrangement extending in another direction (Y direction) perpendicular to the one direction, and another line-and-space arrangement with different dimensions.

The sacrificial gate layers 110 cover the channel regions of the Fin FETs formed with the fin structures 20. In other words, the sacrificial gate layers 110 are formed over the channel regions. The fin structures not covered by the gate layers will become source/drain regions by appropriate source/drain fabrication operations.

Figure 5A:
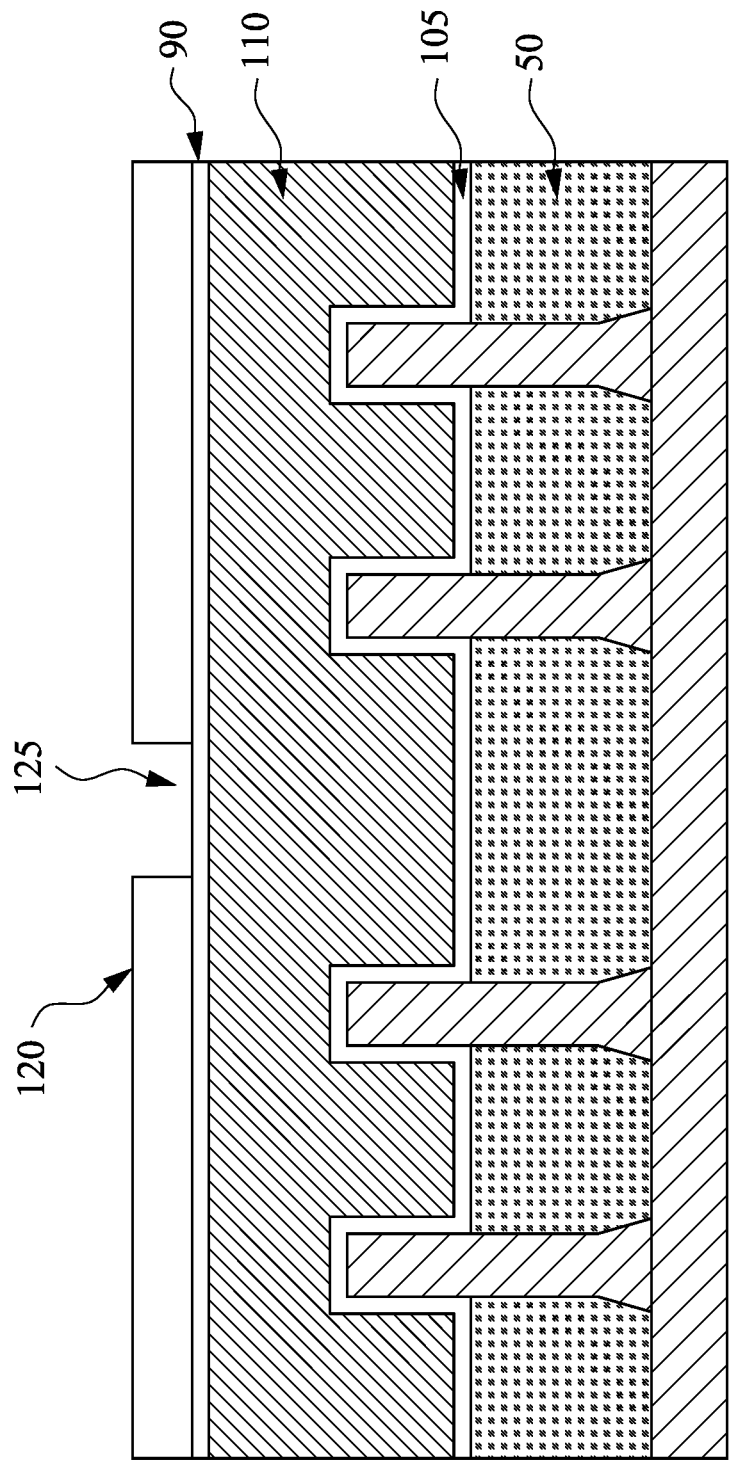
FIGS. 5A, 5B and 5C show various views of one of the various stages of a sequential process for manufacturing an FET device according to an embodiment of the present disclosure.
Figure 5B:
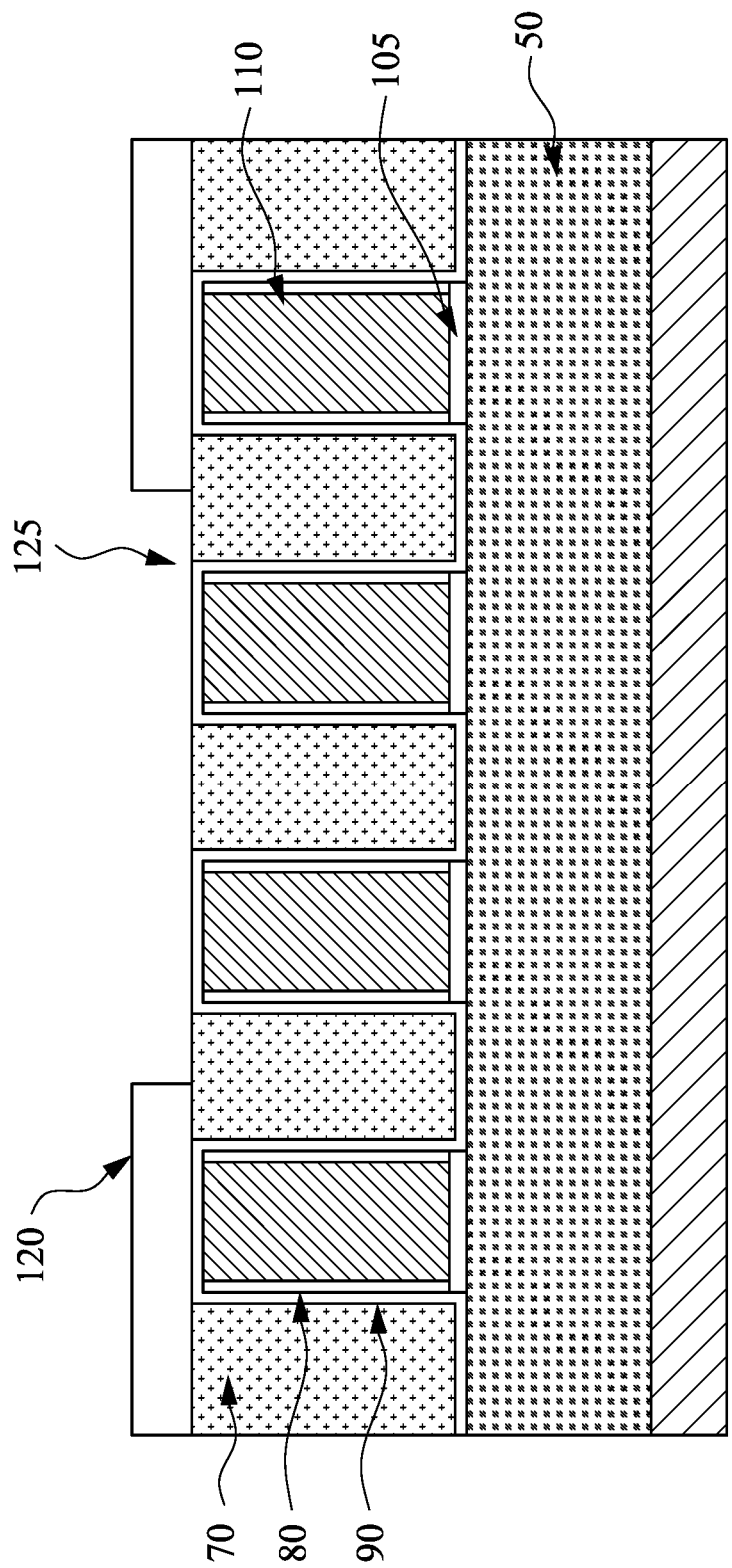
Figure 5C:
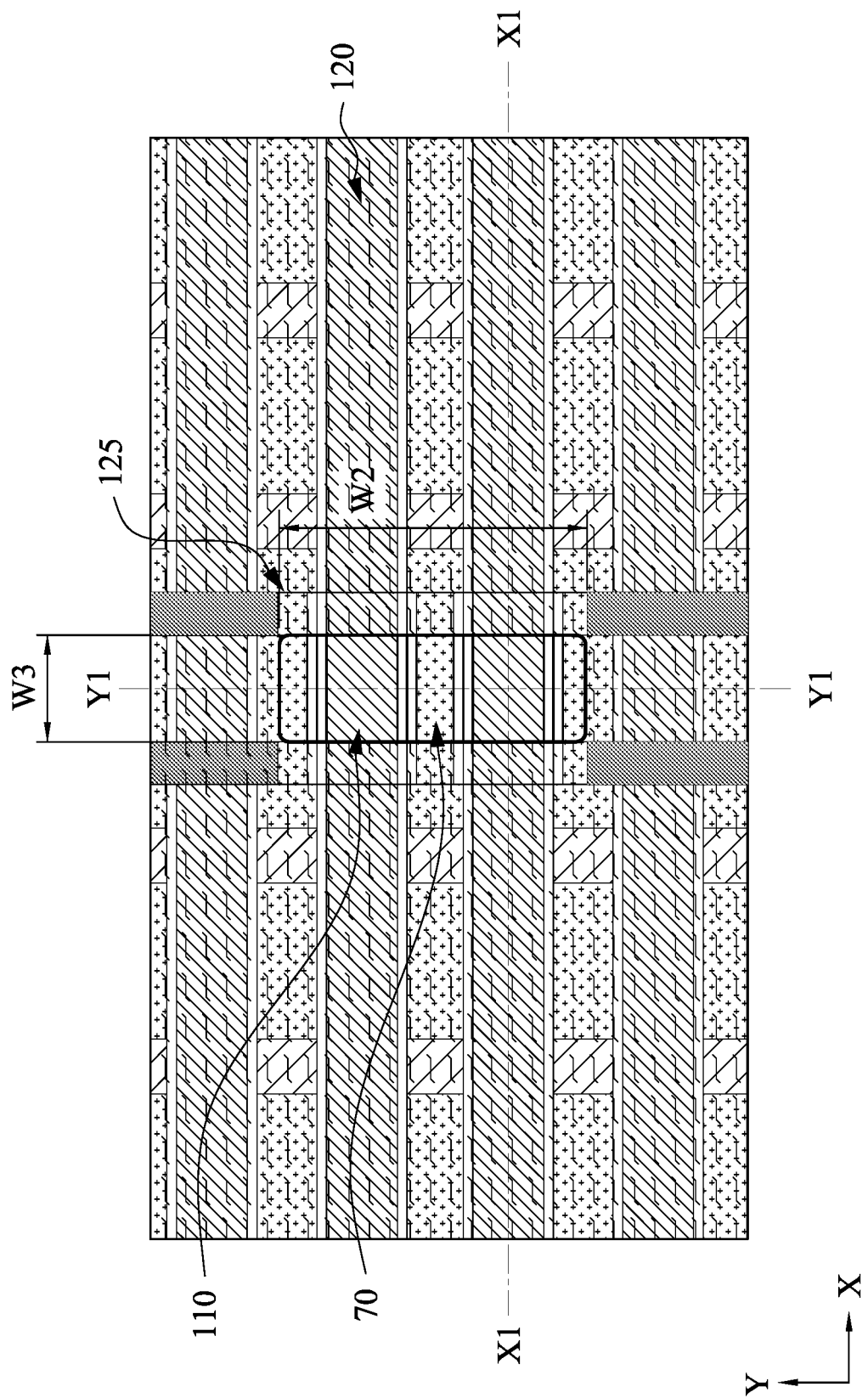

Next, as shown in FIGS. 5A-5C, a mask pattern 120 is formed over the structure shown in FIGS. 4A-4D. FIG. 5A is a cross sectional view corresponding to line X1-X1 in FIG. 4A, FIG. 5B is a cross sectional view corresponding to line Y1-Y1 in FIG. 4A, and FIG. 5C is a top view. The mask pattern 120 is formed by, for example, a material having a high etching selectivity to poly silicon. In one embodiment, the mask pattern 120 is made of silicon nitride. The mask pattern 120 has an opening 125. A width W2 of the opening 125 along the X direction is in a range from about 5 nm to about 100 nm in some embodiments, and in a range from about 10 nm to 30 nm in other embodiments, depending on the pitch of the gate structures. The width W2 of the opening 125 along the Y direction is adjusted to expose a desired number of gate structures. In FIG. 5C, the width of the opening 125 along the Y direction is such a length that two gate structures are exposed in the opening 125, and the edges of the opening in the Y direction are located between the adjacent gate structures over the ILD layer 70. In some embodiments, the width W2 satisfy 2L+S<W2<2L+3S, where L is a width of the gate structure and S is a space between adjacent gate structures. In other embodiments, the opening 125 is disposed over three or more gate structures, e.g., three, four, five or six. A width W3 of the opening 125 along the Y direction is in a range from about 10 nm to about 50 nm in some embodiments, and in a range from about 15 nm to 30 nm in other embodiments, depending on the pitch of the fin structures.

Figure 6A:
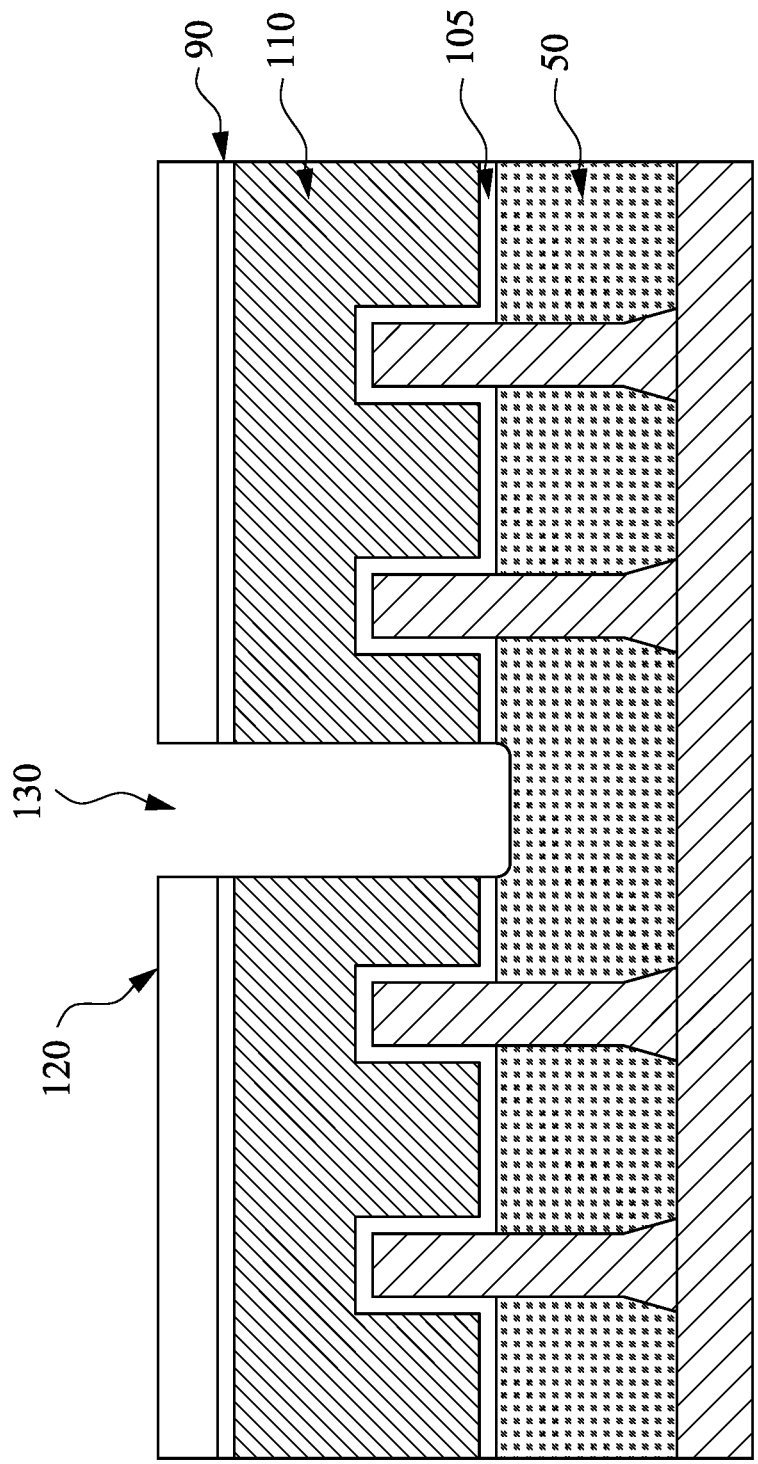
FIGS. 6A, 6B, 6C and 6D show various views of one of the various stages of a sequential process for manufacturing an FET device according to embodiments of the present disclosure.
Figure 6B:
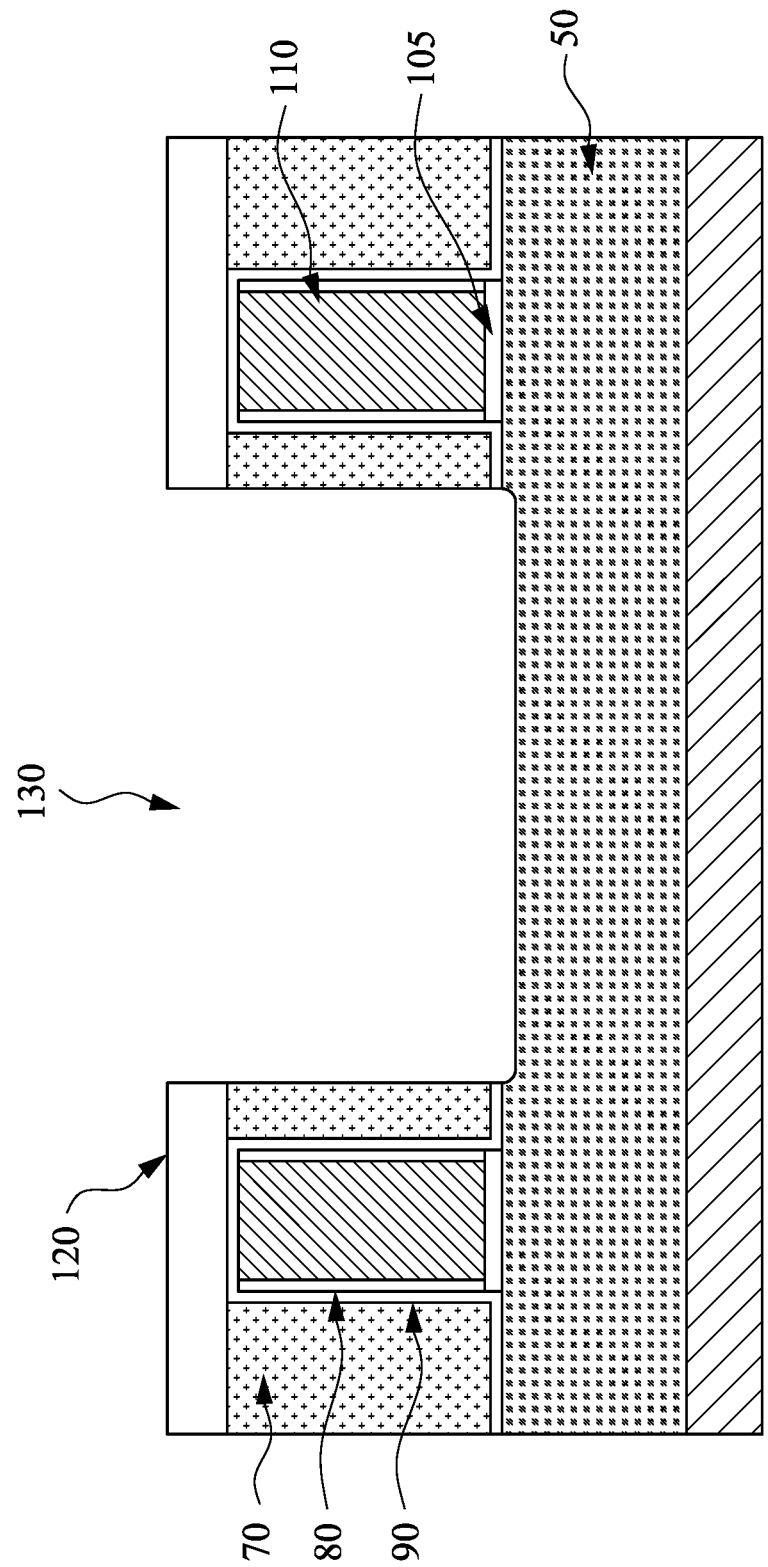

Then, as shown in FIGS. 6A and 6B, by using the mask pattern 120 as an etching mask, a part of sacrificial gate layer 110, the gate insulating layer 105, the gate sidewall spacers 80, the etch stop layer 90 and the ILD layer 70 are removed, so as to obtain a separation opening 130 that separates the sacrificial gate layers 110. The etching of the gate layer is performed by plasma etching using gases including $CH_4$, $CF_4$, $CH_2F_2$, $CHF_3$, $O_2$, HBr, $Cl_2$, $NF_3$, $N_2$ and/or He under a pressure of 3 to 20 mTorr, in some embodiments. Since various material are etched, the etching operation includes multiple etching operations using different etchants in some embodiments. The etching operation includes one or more wet etching and/or dry etching operations.

The etching to form the separation opening 130 accompanies etching the oxide layers (with different etching conditions than the poly silicon etching and/or silicon nitride etching) including the gate insulating layer 105. During the oxide etching, the surface portion 51 of the isolation insulating layer 50 is also etched, as shown in FIGS. 6A and 6B in some embodiments. The depth D1, which is an etched depth of the surface portion 51 of the isolation insulating layer 50 is in a range from about 1 nm to about 10 nm.

It is noted that the cross sectional views of the separation opening 130 has a rectangular shape in FIG. 6A, but in some embodiments, the separation opening 130 has a tapered shape having a larger top size and a smaller bottom size. Further, as shown in FIG. 6B, the sidewall insulating layers 80 and the CESL 90 remain in the openings 130.

Figure 6C:
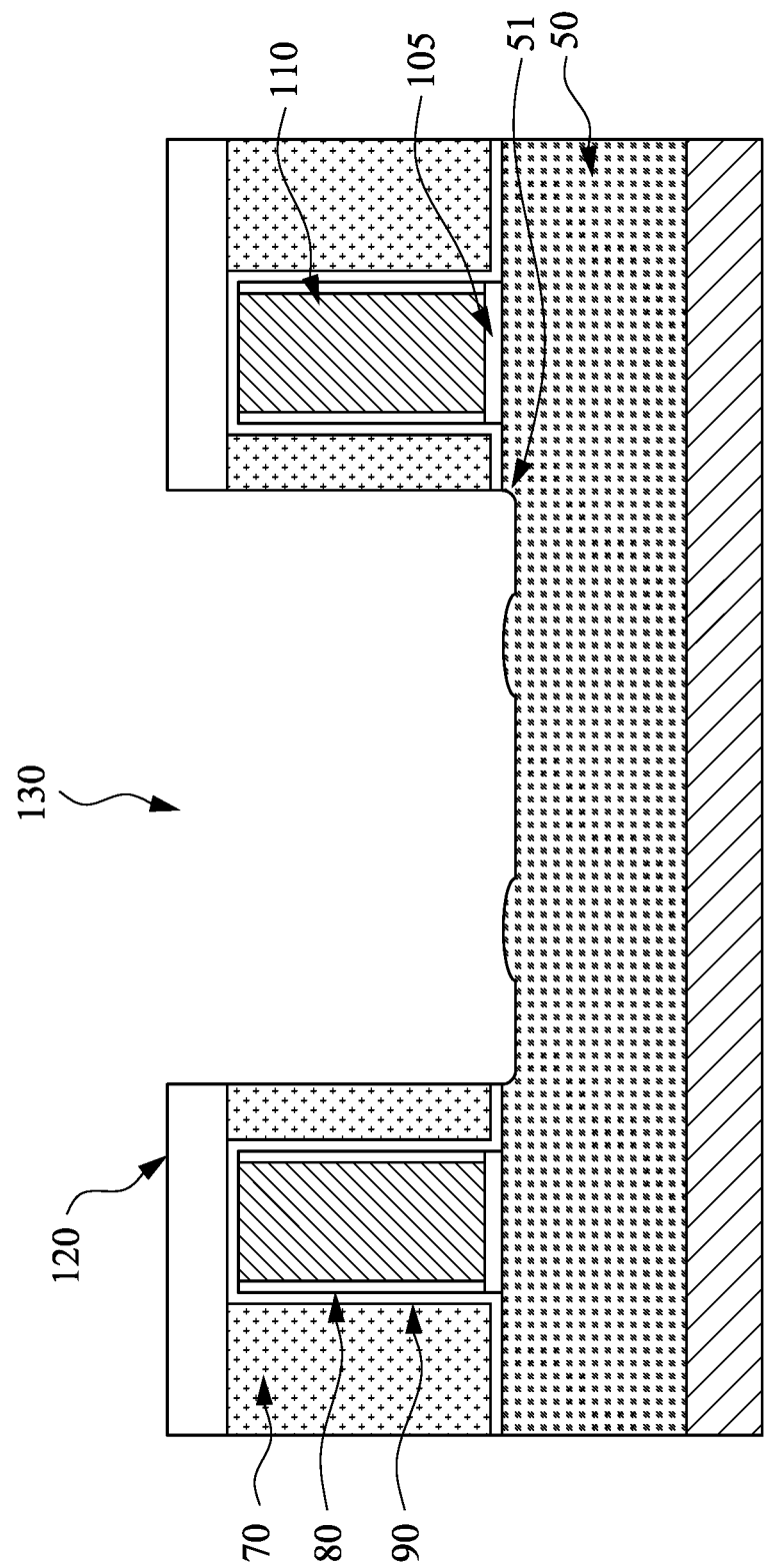
Figure 6D:
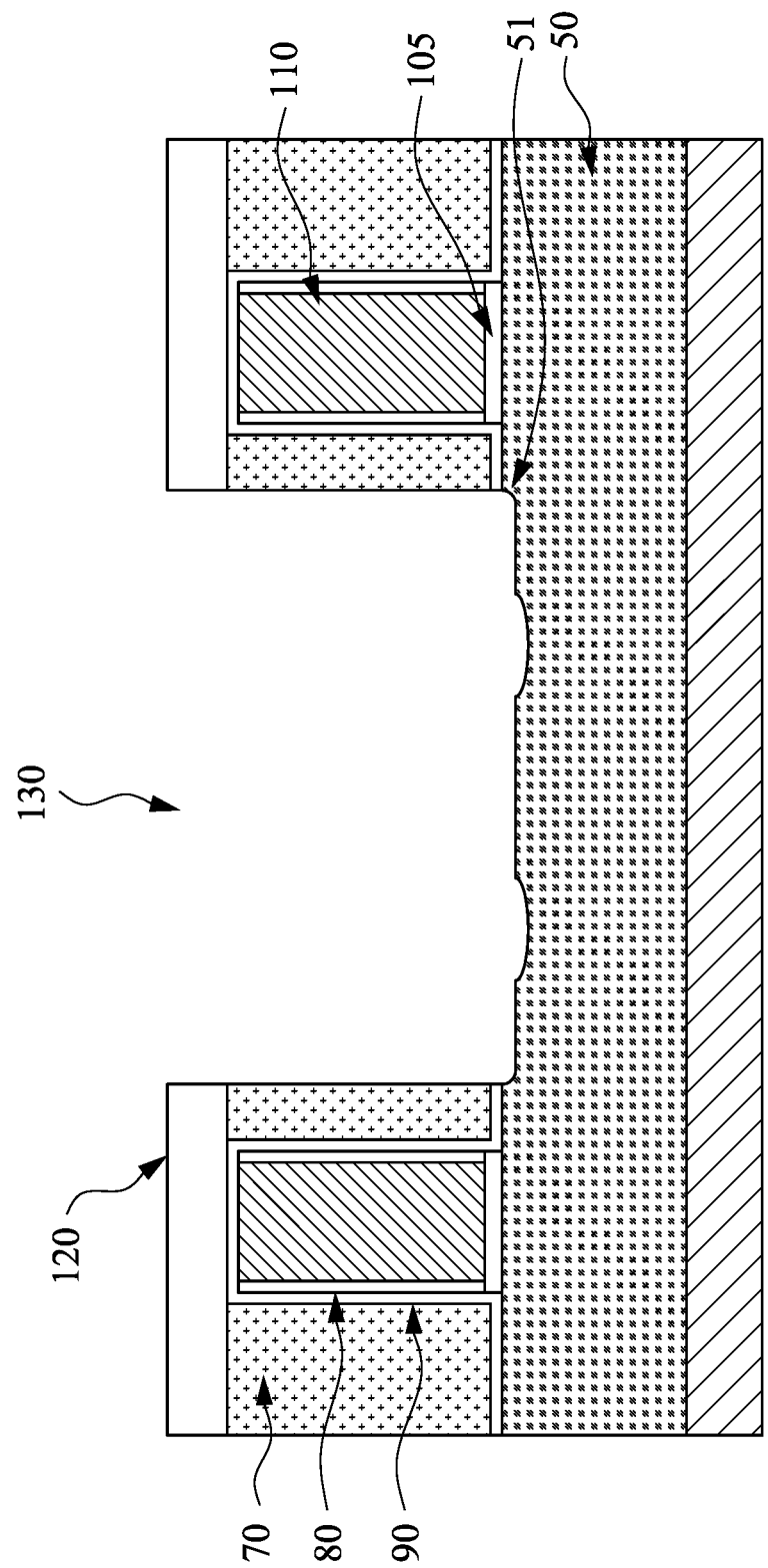

In addition, as shown in FIGS. 6C and 6D, the bottom of the separation opening 130 has convex and concave portions reflecting the gate structures. In some embodiments, as shown in FIG. 6C, the bottom of the separation opening 130 includes protrusions at locations corresponding to the gate structures, and in other embodiments, as shown in FIG. 6D, the bottom of the separation opening 130 includes recesses at locations corresponding to the gate structures. In some embodiments, the unevenness of the bottom of the separation opening 130 is in a range from about 5 nm to about 20 nm (max-min value).

Figure 7A:
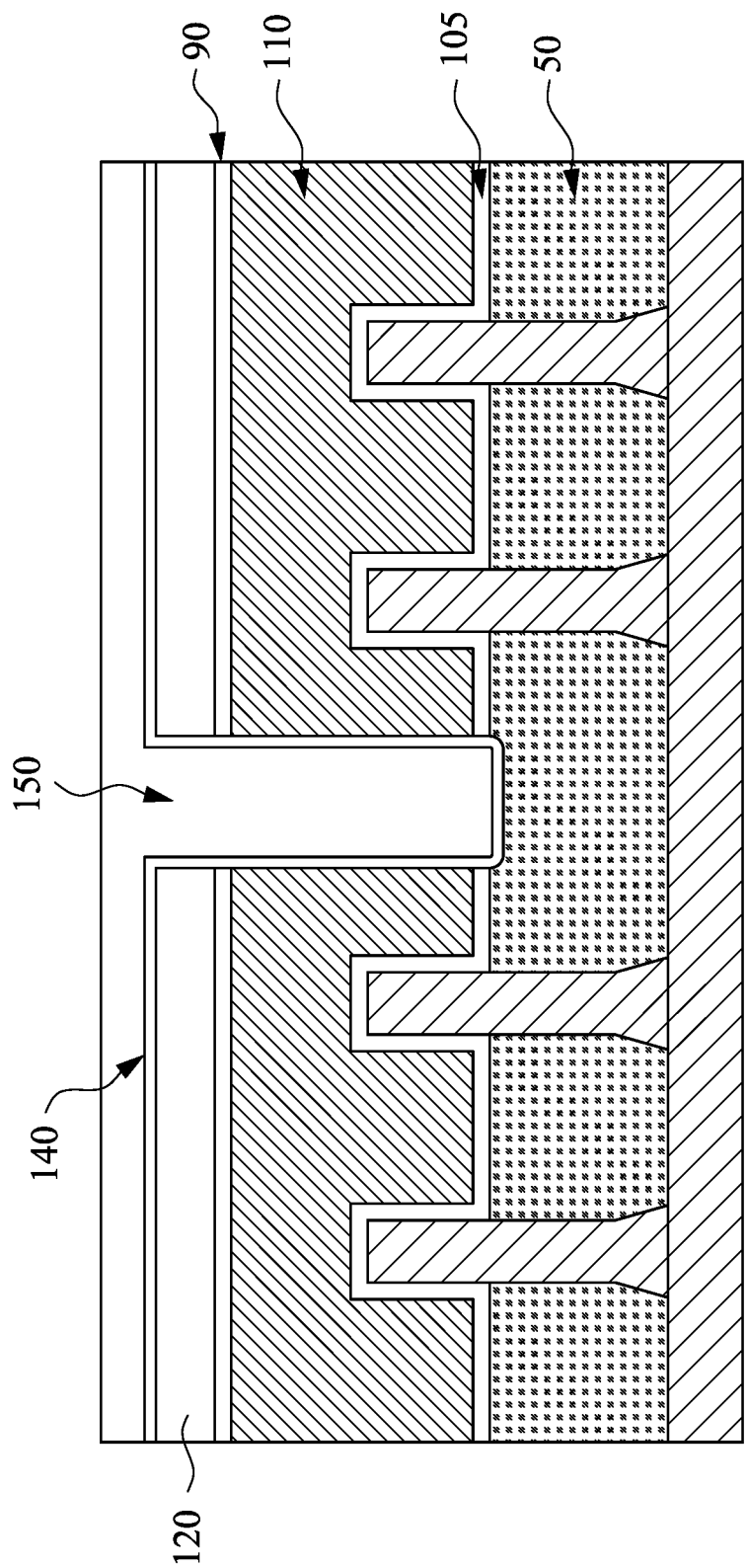
FIGS. 7A and 7B show various views of one of the various stages of a sequential process for manufacturing an FET device according to an embodiment of the present disclosure.
Figure 7B:
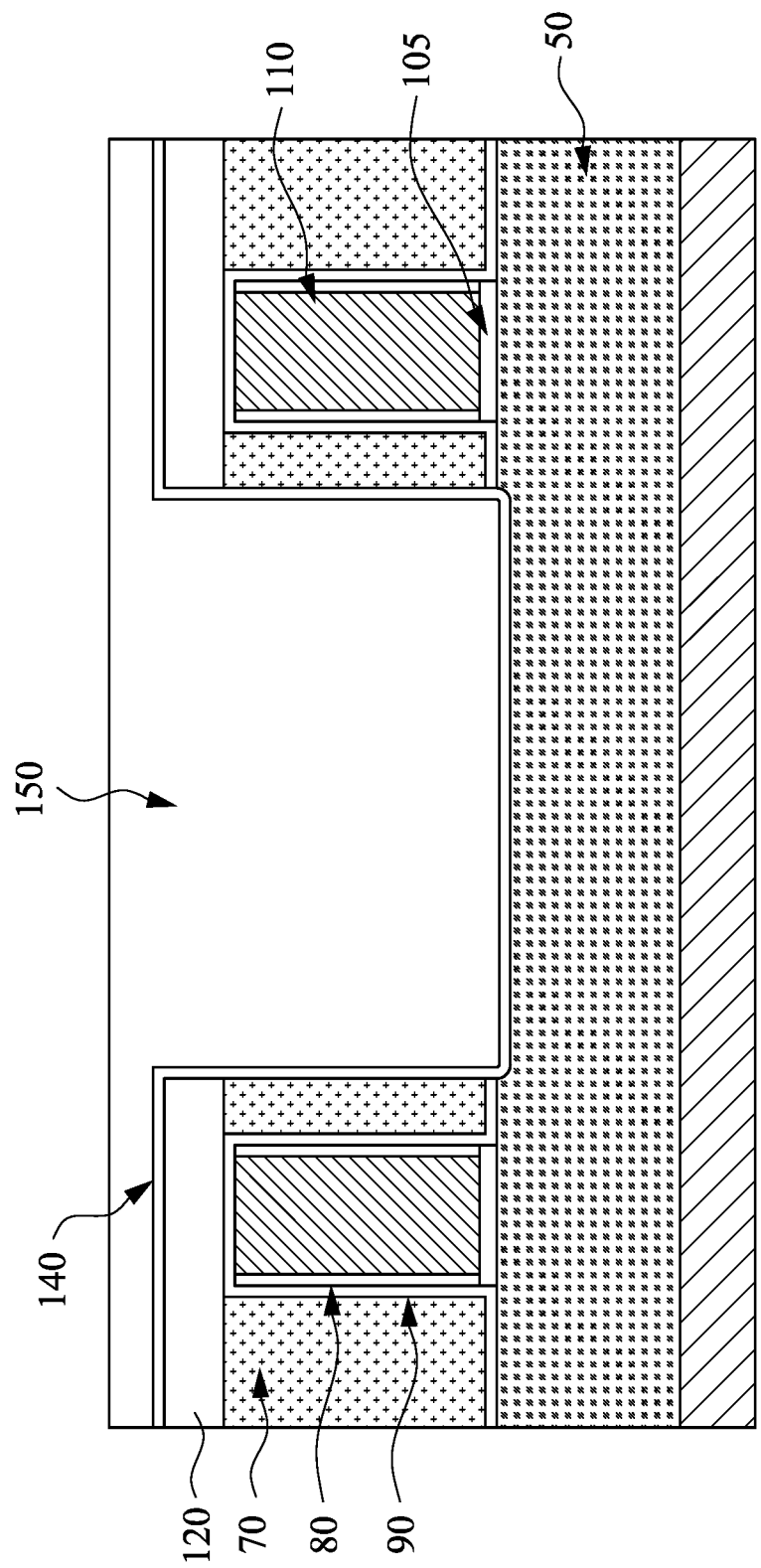

Then, as shown in FIGS. 7A and 7B, a thin filling insulating layer 140 and a thick filling insulating layer 150 are formed over the resultant structure of FIGS. 6A and 6B.

The thin insulating layer 140 is made of, for example, the same material as the gate insulating layer 105. In this embodiment, silicon oxide is used. The thin filling insulating layer 140 is made by CVD or ALD. In certain embodiments, ALD is employed. In some embodiments, the ALD is performed at a substrate temperature in a range from about 25° C. (room temperature) to about 400° C. and in other embodiments the temperature is in a range from about 65° C. to 150° C., depending on the desired thickness and/or coverage of the thin insulating layer. In some embodiments, the ALD is performed at a pressure in a range from about 1500 mTorr to about 4000 mTorr, depending on the desired thickness and/or coverage of the thin insulating layer. In some embodiments, precursors (e.g., $SiH_4$, $Si_2H_6$, $O_2$) are supplied as gas pulses, and one cycle of the ALD process includes one pulse of supplying Si precursor and one pulse of supplying O precursor. In some embodiments, two to 30 cycles of the ALD process are performed, depending on the desired thickness of the thin insulating layer. In some embodiments, a surface roughness of the thin filling insulating layer 140 formed on the mask pattern 120 is in a range from about 0.1 nm to about 2.5 nm.

The thickness of the thin filling insulating layer 140 is in a range from about 0.5 nm to about 5 nm in some embodiments, and is in a range from about 1 nm to about 3 nm in other embodiments. As shown in FIGS. 7A and 7B, the thin filling insulating layer 140 is conformally formed in the separation opening 130 and over the mask pattern 120.

The thick filling insulating layer 150 is made of different material than the thin filling insulating material 140 and includes silicon nitride based materials such as SiN, SiCN, SiON or SiOCN. In one embodiment, silicon nitride is used. The thick filling insulating layer 150 is made by CVD or ALD. In certain embodiments, ALD is employed. The thick filling insulating layer 150 is conformally formed over the thin filling insulating layer 140 in the separation opening 130 and over the mask pattern 120. In some embodiments, the bottom of the thin filling insulating layer 140 has unevenness reflecting the unevenness of the bottom of the separation opening 130.

Figure 8A:
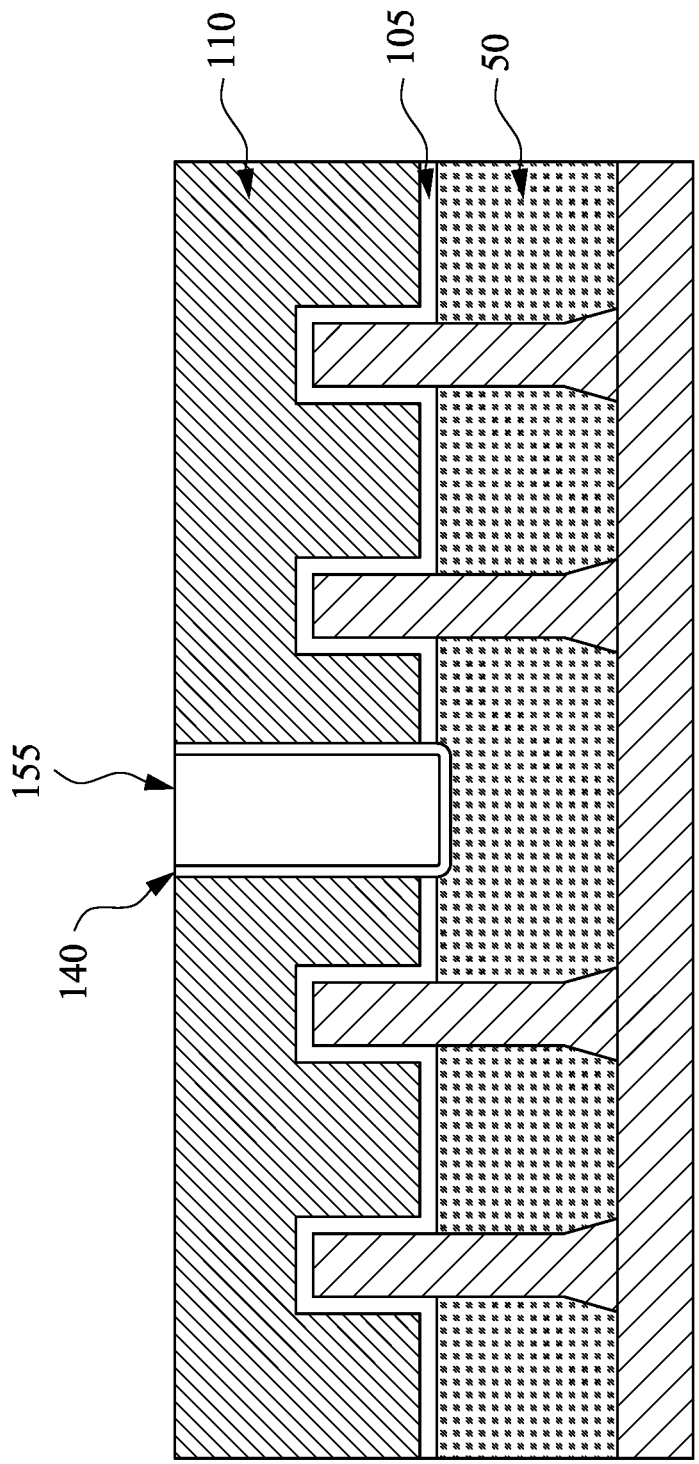
FIGS. 8A and 8B show various views of one of the various stages of a sequential process for manufacturing an FET device according to an embodiment of the present disclosure.
Figure 8B:
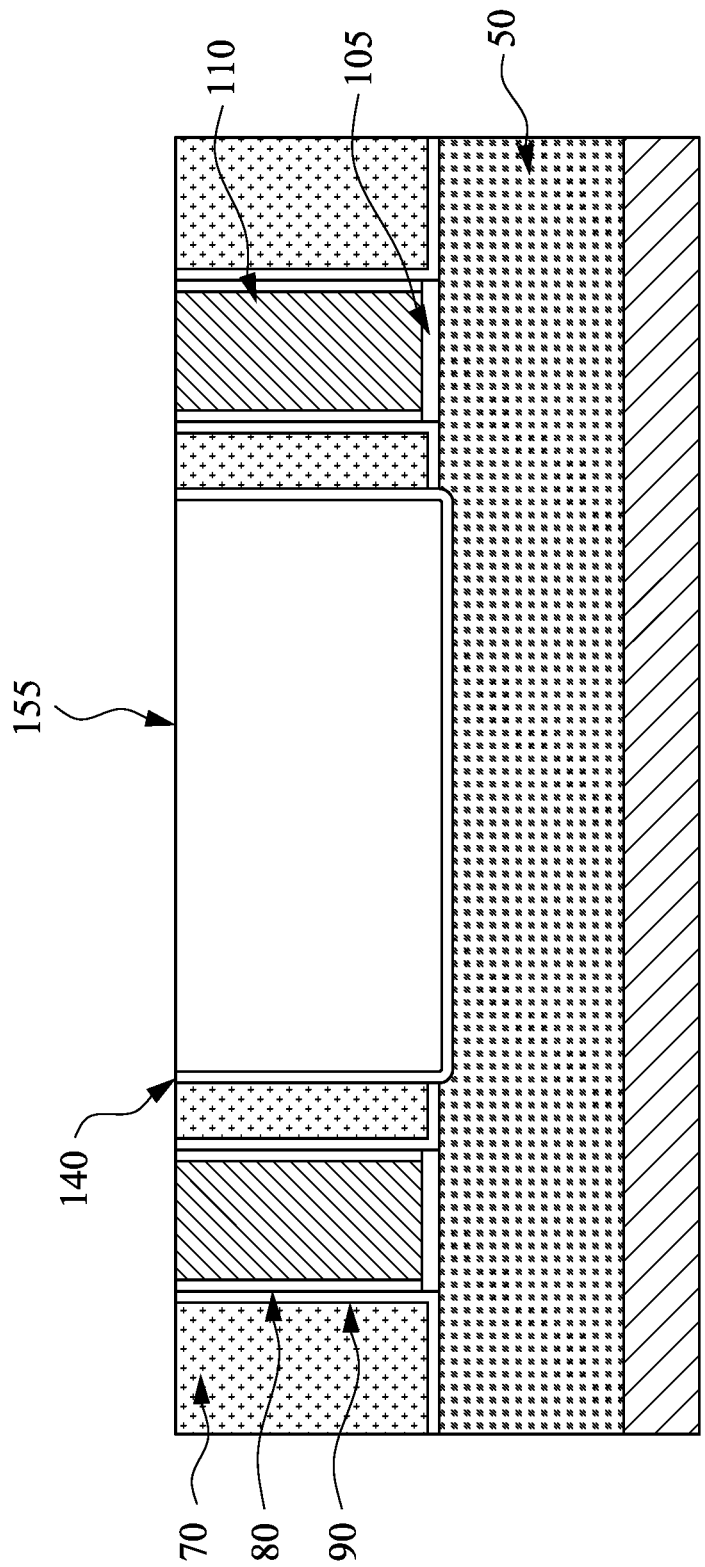

After the separation opening 130 is filled by the thin filling insulating layer 140 and the thick filling insulating layer 150, a planarization operation, such as a CMP process, is performed to expose the upper surface of the sacrificial gate layers 110, as shown in FIGS. 8A and 8B. In other words, the sacrificial gate layers 110 function as a stopper for the CMP process. By this planarization operation, a separation wall 155 is formed.

Figure 9A:
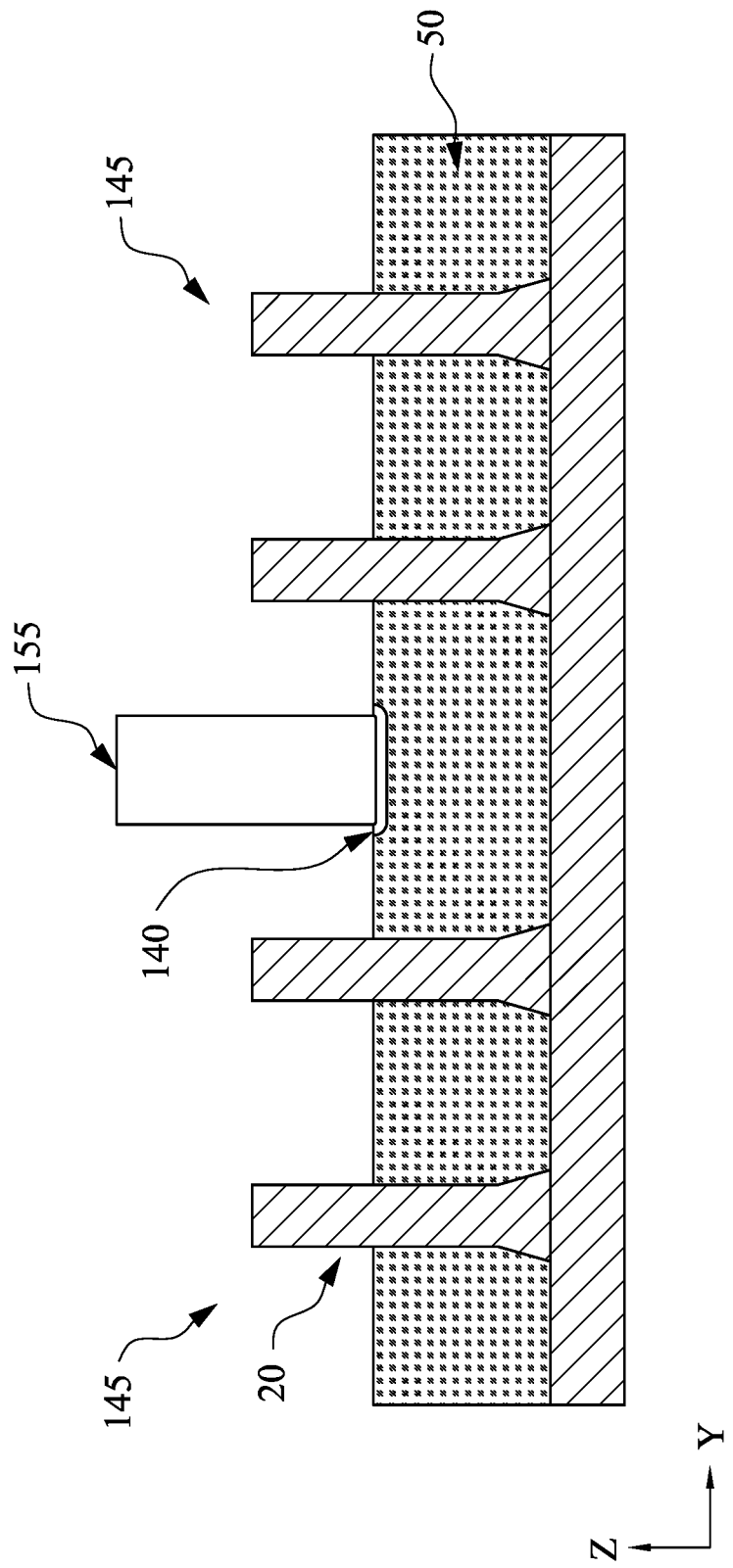
FIGS. 9A and 9B show various views of one of the various stages of a sequential process for manufacturing an FET device according to an embodiment of the present disclosure.
Figure 9B:
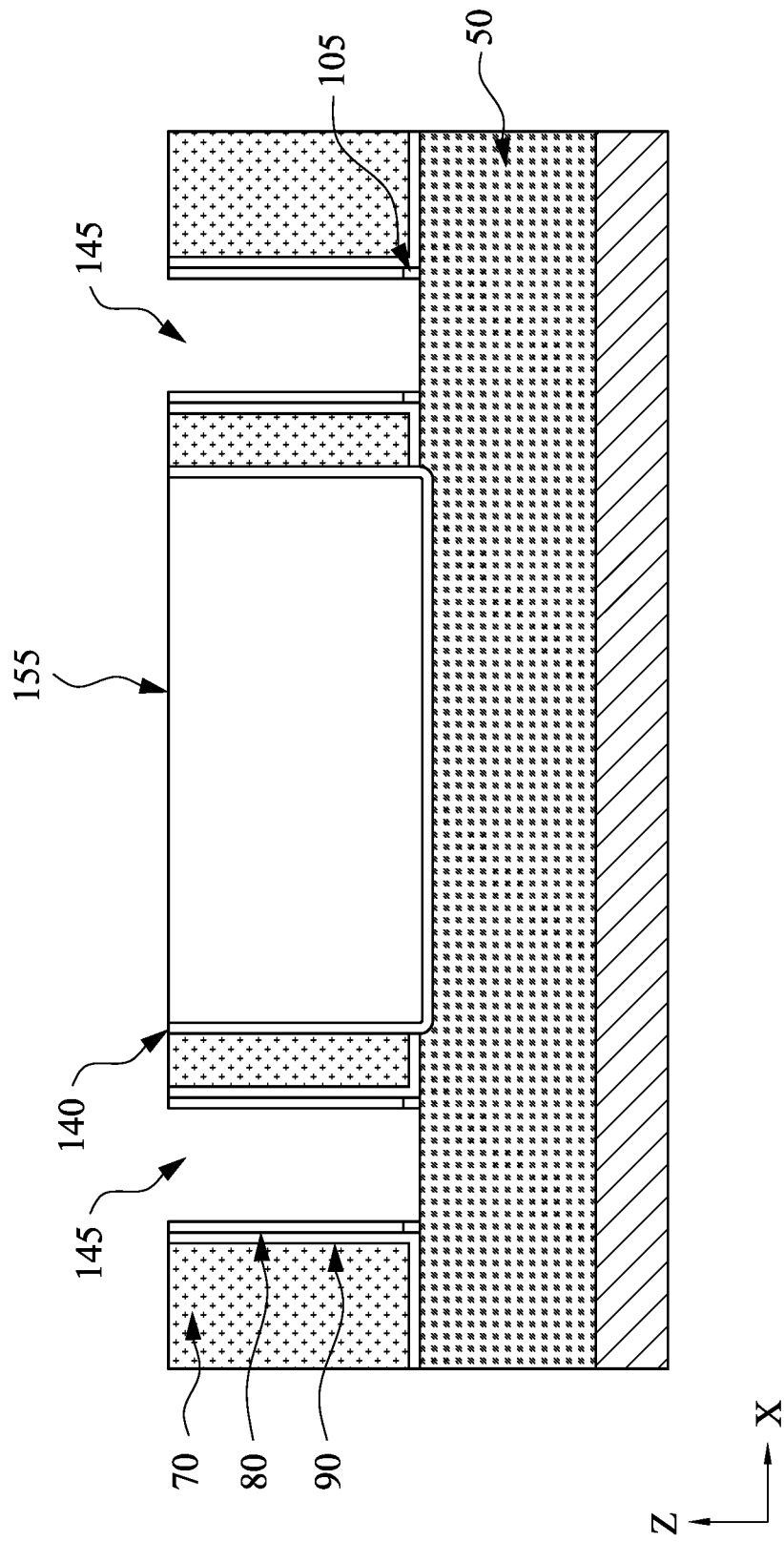

After the planarization operation to expose the sacrificial gate layers 110, the sacrificial gate layers 110 and sacrificial gate insulating layer 105 are removed by using dry etching and/or wet etching, thereby forming gate openings 145, as shown in FIGS. 9A and 9B. During the removal of the sacrificial gate insulating layer 105, since the thin filling insulating layer 140 is made of the same material as the sacrificial gate insulating layer 105 (e.g., silicon oxide), part of the thin filling insulating layer 140 exposed to the etching process is also removed. As shown in FIG. 9A, the thin filling insulating layer 140 which has been disposed between the sacrificial gate layer 110 and the thick filling insulating layer 150 is removed.

Next, as shown in FIGS. 10A-10D, metal gate structures including a gate dielectric layer 160 and a metal gate electrode layer 170 are formed.

In certain embodiments, the gate dielectric layer 160 includes one or more layers of dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The metal gate electrode layer 170 includes any suitable material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments, one or more work function adjustment layers (not shown) are also disposed between the gate dielectric layer 160 and the metal gate electrode layer 170. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

In forming the metal gate structures, the gate dielectric layer, the work function adjustment layer and the gate electrode layer are formed by suitable film forming method, for example, CVD or ALD for gate dielectric layer, and CVD, PVD, ALD or electroplating for the metal layers, and then a planarization operation such as CMP is performed.

Figure 10A:
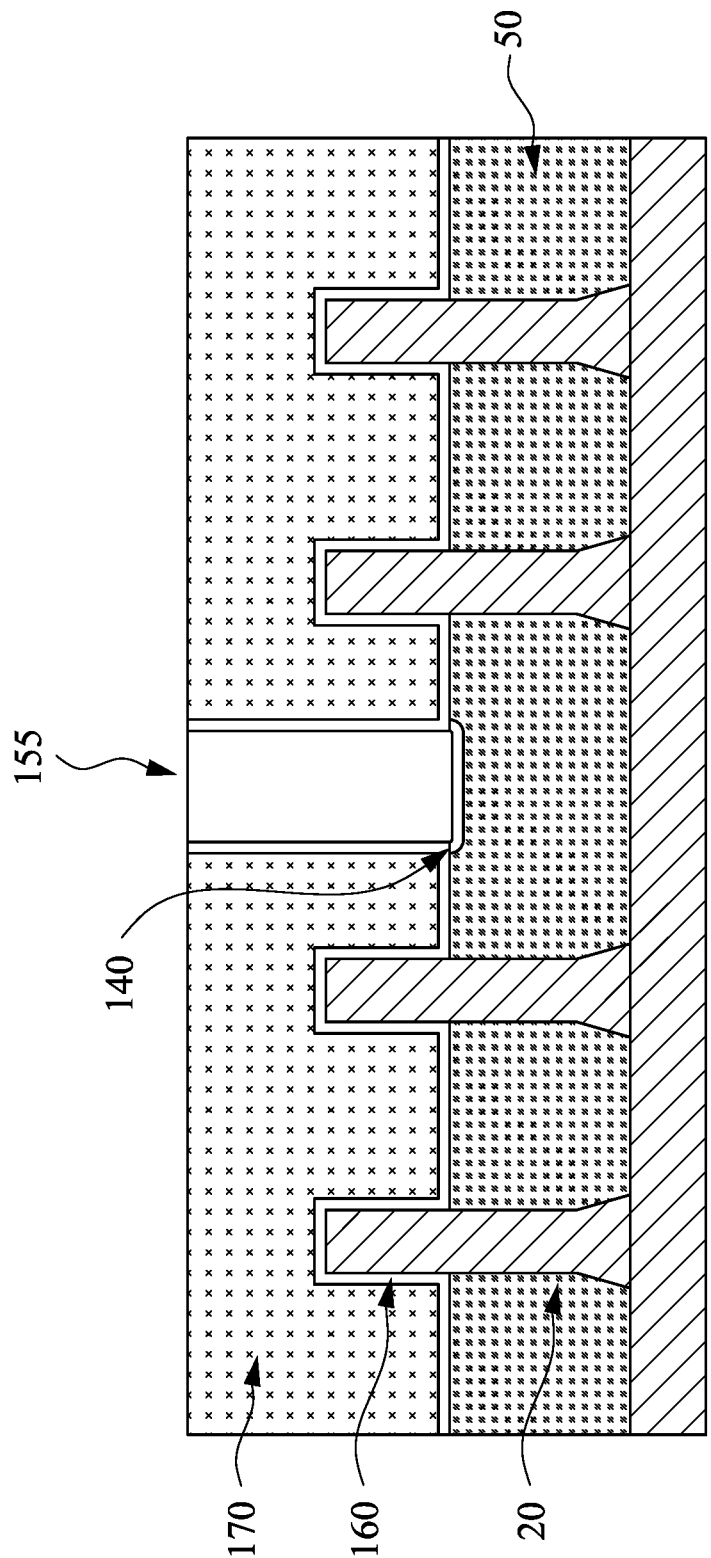
FIGS. 10A, 10B, 10C and 10D show various views of one of the various stages of a sequential process for manufacturing an FET device according to an embodiment of the present disclosure.
Figure 10B:
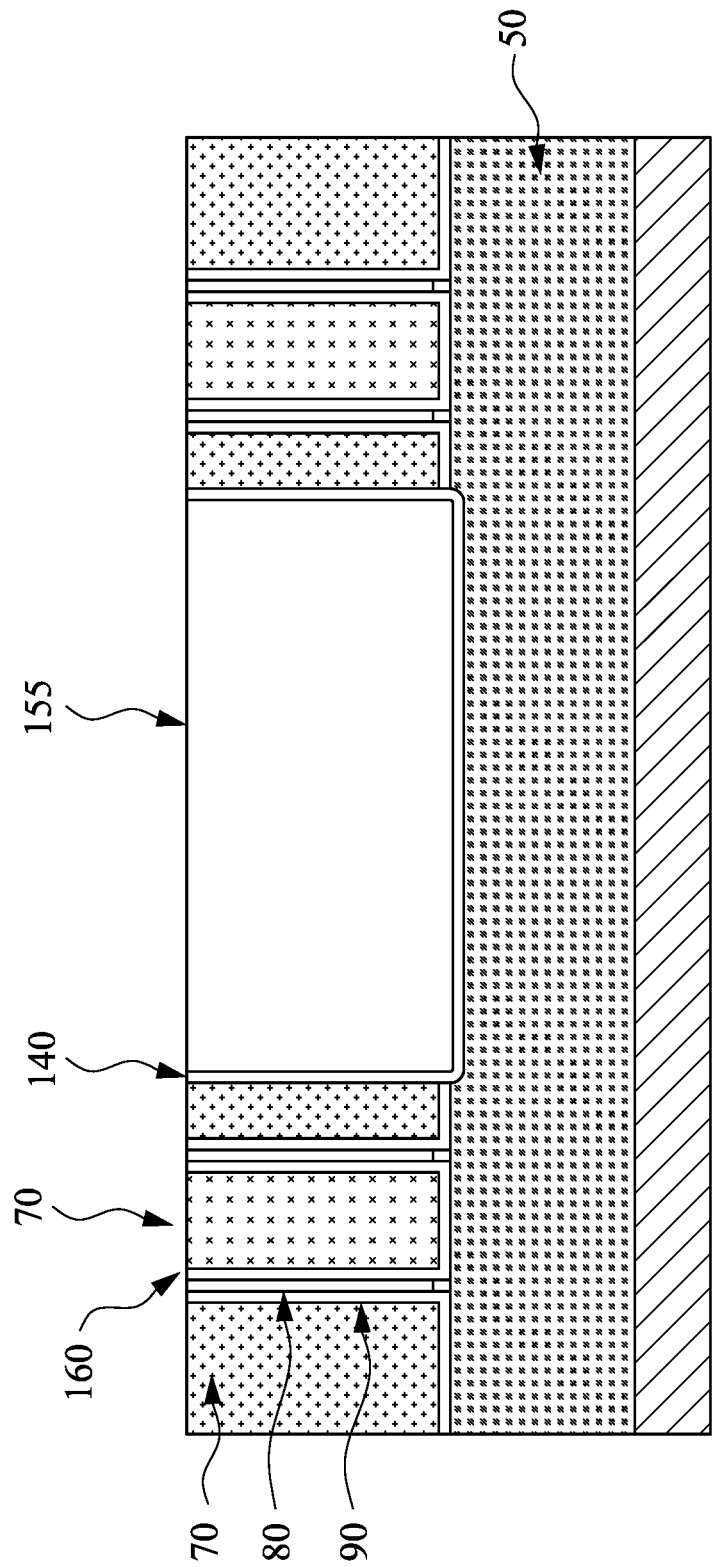

In some embodiments, the gate dielectric layer 160 is in contact with the thin filling insulating layer 140 as shown in FIG. 10A.

Figure 10C:
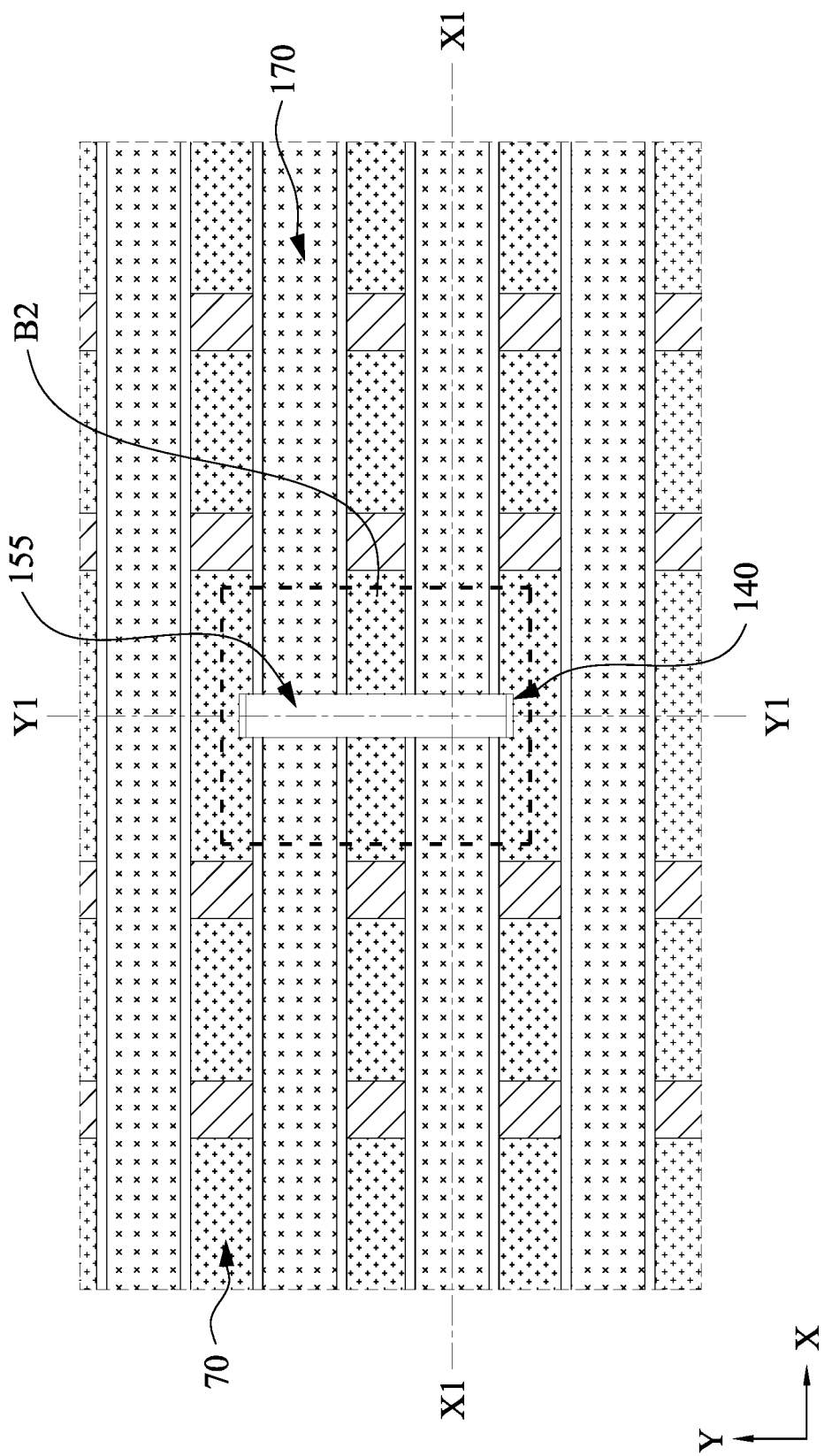
Figure 10D:
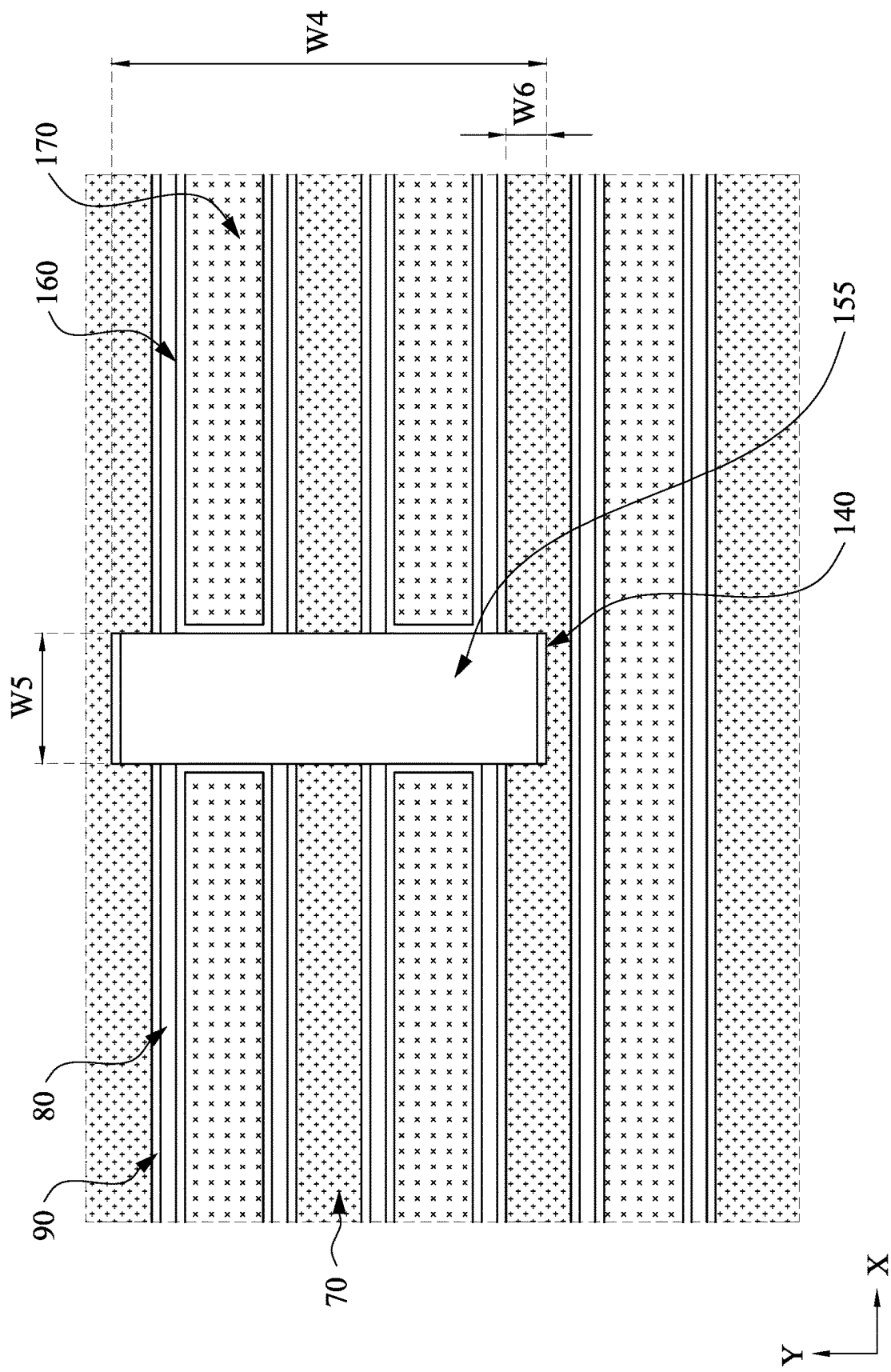

FIGS. 10C and 10D show top views after the metal gate structures are formed. FIG. 10D is an enlarged view of the enclosed portion B2 in FIG. 10C. As shown in FIGS. 10C and 10D, the metal gate structures (160, 170) are separated by one continuous separation wall 155.

As shown in FIG. 10D, a width W4 of the separation wall 155 along the X direction (including the thin filling insulating layer 140) is in a range from about 5 nm to about 100 nm in some embodiments, and in a range from about 10 nm to 30 nm in other embodiments, depending on the pitch of the gate structures. A width W5 of the separation wall 155 along the Y direction is in a range from about 8 nm to about 40 nm in some embodiments, and in a range from about 12 nm to 25 nm in other embodiments. In some embodiments, a ratio W4/W5 is in a range from about 2 to about 5. A protrusion amount W6 between the etch stop layer 90 and the end of the separation wall 155 is in a range from about 2 nm to about 10 nm in some embodiments, depending on the pitch of the gate electrodes.

It is understood that the structure shown in FIGS. 10A-10D undergoes further CMOS processes to form various features such as interconnect vias, interconnect metal layers, passivation layers, etc.

In the foregoing embodiment, the sacrificial gate layer 110 is separated into two gate layers. However, in other embodiments, the sacrificial gate layer 110 is separated into more than two gate layers by the patterning operations of FIGS. 6A-8B. In such a case, as shown in FIG. 11A, multiple gate structures each including the gate electrode layer 170 are aligned and separated by separation walls 155.

Figure 11A:
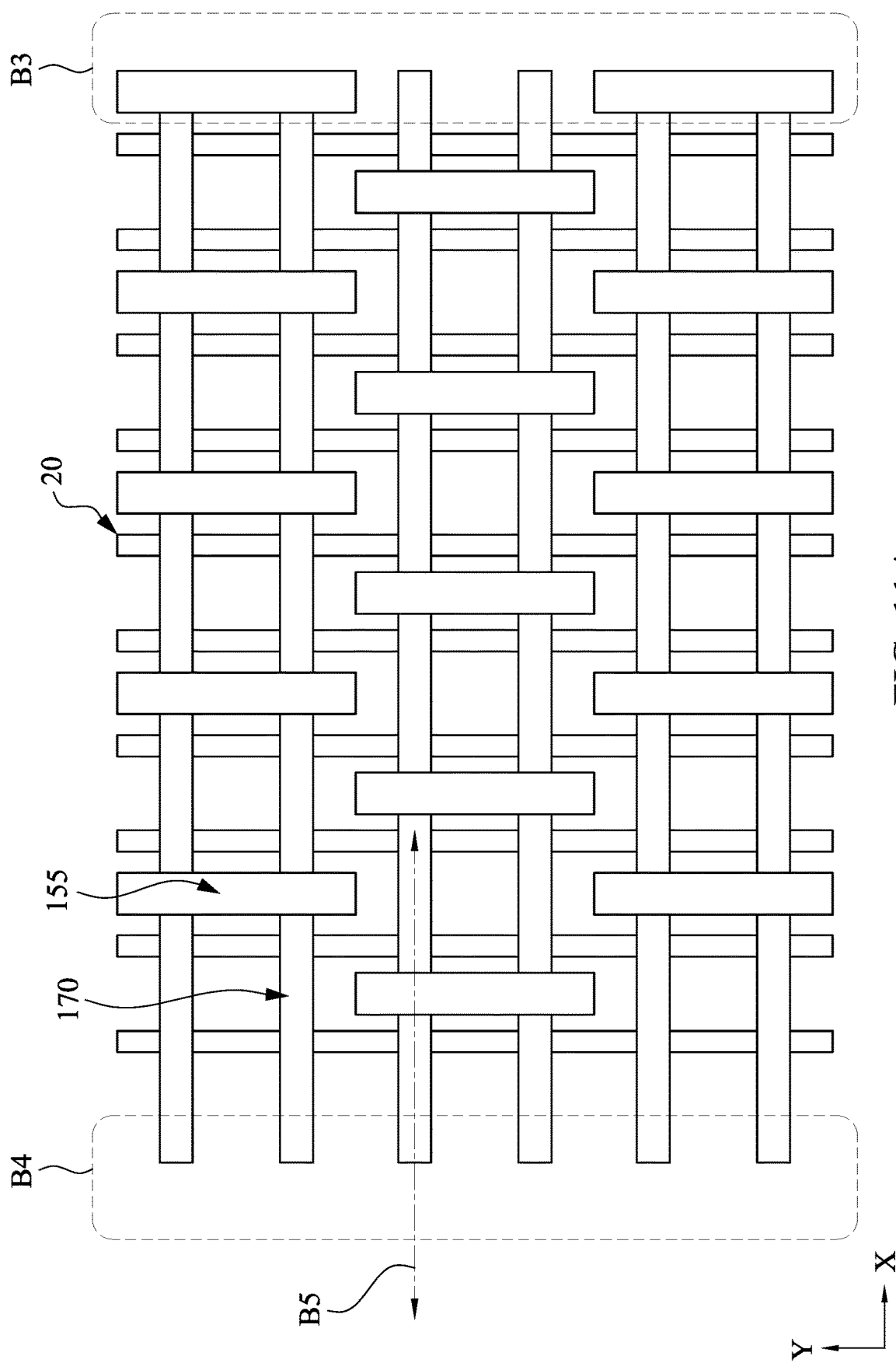
FIGS. 11A and 11B show structures of a semiconductor device according to an embodiment of the present disclosure.

In some embodiments, one separation wall 155 separates a pair of gate electrodes 170 as shown in FIG. 11A. In some embodiments, the separation walls 155 are arranged in a staggered manner as shown in FIG. 11A. In some embodiments, the pitch of the separation walls 155 in the X direction is about twice the pitch of the fin structures 20. In other embodiments, the pitch of the separation walls 155 in the X direction is about three times or four times the pitch of the fin structures 20.

In some embodiments, a circuit of FIG. 11A is for a static random access memory (SRAM).

Further, the sacrificial gate layer 110 has two ends in its longitudinal direction (X direction) before the separation etching operation. In some embodiments, the separation wall 155 is formed in at least one of these ends, as shown in area B3 of FIG. 11A. In such a case, the gate structure including the gate electrode layer 170 is sandwiched by two separation walls 155. In some embodiment, both ends have the separation walls 155.

Figure 11B:
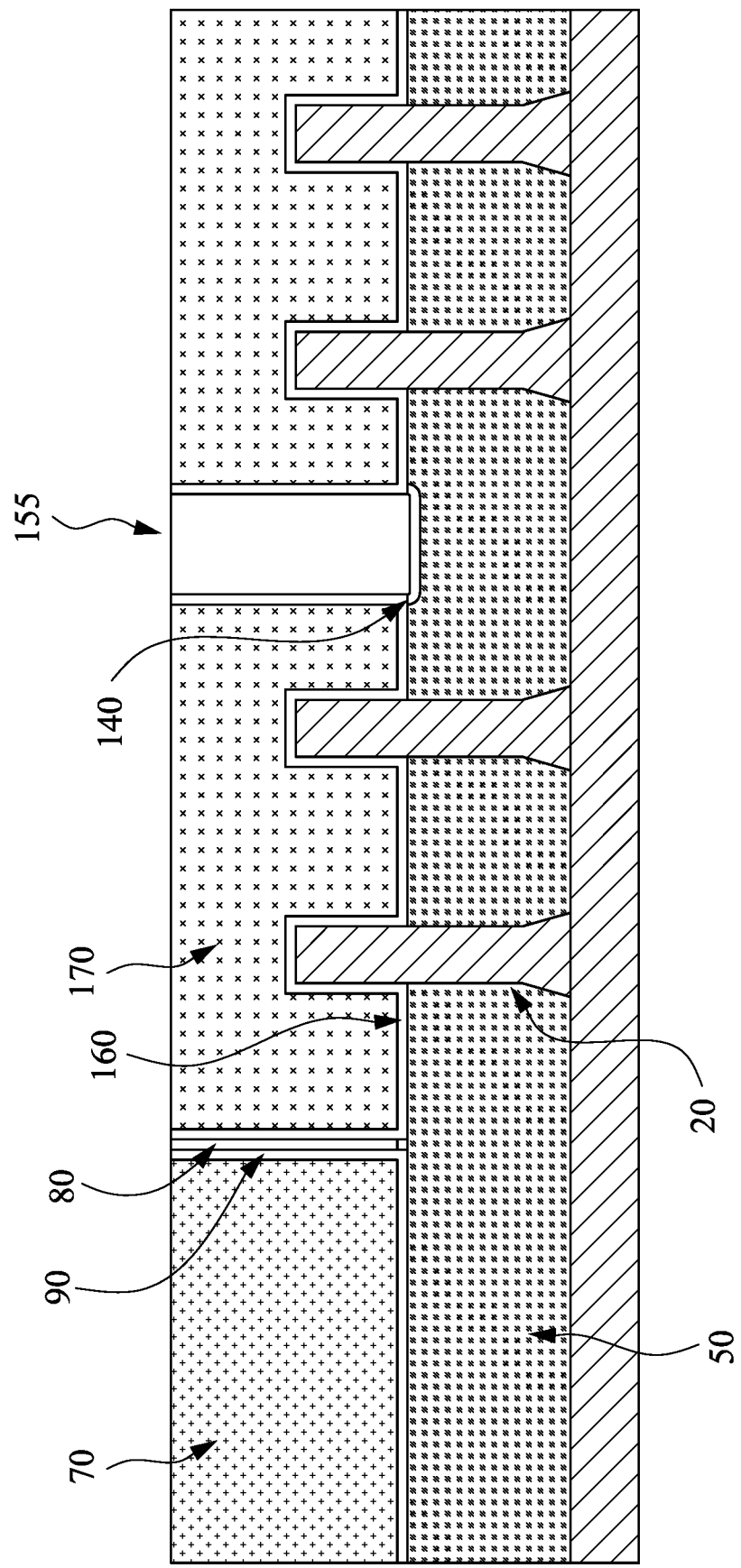

In other embodiments, the separation wall 155 is not formed in at least one of the ends, as shown in area B4 of FIG. 11A. In such a case, one end of the gate structure including the gate electrode layer 170 has a separation wall 155 and the other end of the gate structure has the structure shown in FIG. 11B. FIG. 11B is a cross sectional view of line B5 of FIG. 11A. As shown in FIG. 11B, the gate structure, in particular the gate dielectric layer 160, is in contact with the ILD layer 70. In some embodiments, both ends have no separation walls 155. In some embodiments, the separation wall 155 formed on the ends of the gate structure has a longer width in the Y direction than the separation walls 155 formed on the areas other than the end portions. In some embodiments, the separation wall 155 formed on the ends of the gate structure covers more than two gate structures (e.g., 4-16).

FIGS. 11C-11E show plan views of the separation walls 155 (only the thick filling insulating layer portion is shown) according to various embodiments. In some embodiments, as shown in FIG. 11C, the separation wall 155 has a rectangular shape having rounded corners. In other embodiments, the separation wall 155 has a rectangular body portion and two semi-oval or semi-circular end portions as shown in FIG. 11D. In other embodiments, the separation wall 155 has an oval shape as shown in FIG. 11E. The widths of the separation wall is the maximum length in the X and Y directions.

Figure 12:
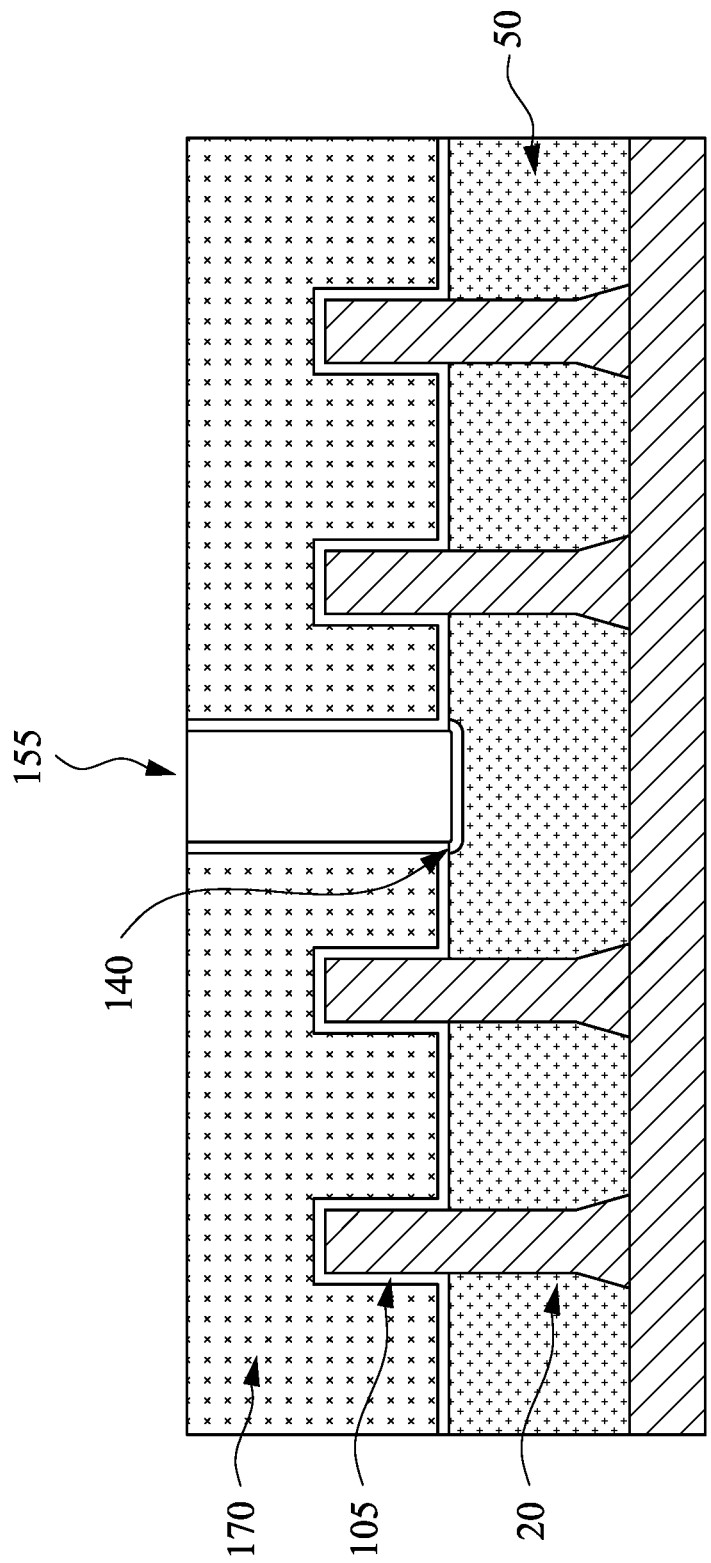
FIG. 12 shows a cross sectional view of an FET device according to another embodiment of the present disclosure.

In another embodiment, a sacrificial gate insulating layer 105 is not a dummy layer and is made of dielectric material finally used in the FET device. In such a case, a high-k dielectric material described above can be used. When the gate insulating layer 105 is not a dummy layer, the gate insulating layer 105 may be made of a different material than the thin filling insulating layer 140. In the operation with respect of FIGS. 9A and 9B, the gate insulating layer 105 (e.g., a high-k dielectric material) is not removed in the openings 145. Then, an additional operation to remove the thin filling insulating layer 140 is performed to obtain the structure similar to FIG. 9A, except for the existence of the gate insulating layer 105. In this case, the metal gate electrode layer 170 is in contact with the separation wall 155, as shown in FIG. 12, because the formation of the gate dielectric layer 160 (see, FIG. 10A) is not necessary.

Figure 13:
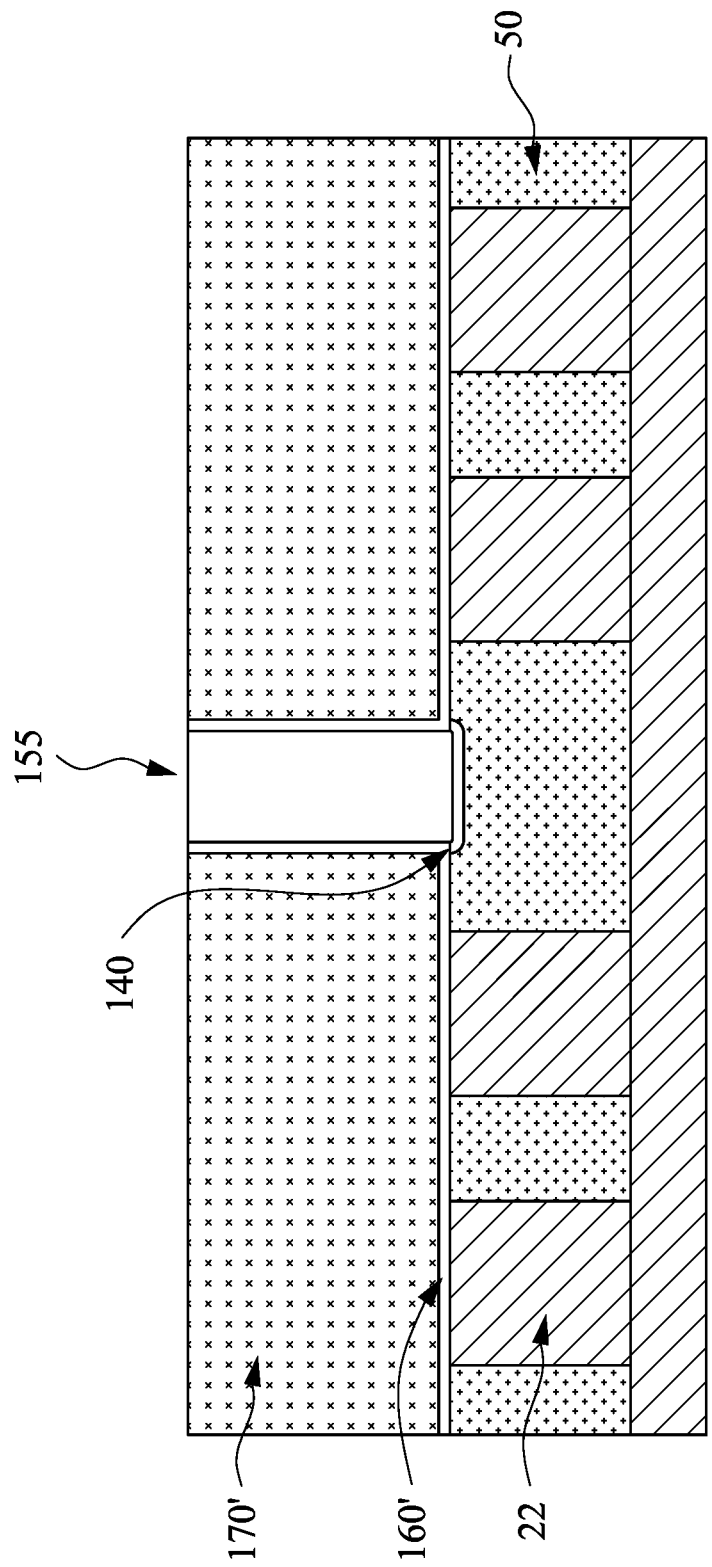
FIG. 13 shows a cross sectional view of an FET device according to another embodiment of the present disclosure.

In the above embodiments, a Fin FET is employed. However, the foregoing technologies can be applied to a planar type FET, as shown in FIG. 13. As shown in FIG. 13, the FET includes a channel region 22 of a semiconductor substrate and a gate structure including a gate dielectric layer 160' formed over the channel region 22 and a gate electrode layer 170' formed over the gate dielectric layer 160'. The channel regions are separated by the isolation insulating layers 50 and two gate structures are separated by a separation wall 155.

The various embodiments or examples described herein offer several advantages over the existing art. For example, since the thin insulating filling layer 140 is subsequently removed, the width in the Y direction of the gate space to be filled by metal gate materials can become larger. With the enlarged gate opening, the metal gate materials such as a metal gate electrode material can be fully filled in the opening without forming voids.

It will be understood that not all advantages have been necessarily discussed herein, no particular advantage is required for all embodiments or examples, and other embodiments or examples may offer different advantages.

In accordance with one aspect of the present disclosure, a semiconductor device including fin field-effect transistors, includes a first gate structure extending in a first direction, a second gate structure extending in the first direction and aligned with the first gate structure in the first direction, a third gate structure extending in the first direction and arranged in parallel with the first gate structure in a second direction crossing the first direction, a fourth gate structure extending the first direction, aligned with the third gate structure and arranged in parallel with the second gate structure, an interlayer dielectric layer disposed between the first to fourth gate electrodes, and a separation wall made of different material than the interlayer dielectric layer and disposed between the first and third gate structures and the second and fourth gate structures. In one or more of the foregoing and following embodiments, the separation wall is in contact with the first to fourth gate structures and is in contact with no gate structure other than the first to fourth gate structures. In one or more of the foregoing and following embodiments, side layers are disposed on side faces in the second direction of the separation wall, and a material forming a core portion of the separation wall is different from a material forming the side layers. In one or more of the foregoing and following embodiments, the core portion of the separation wall is made of a silicon nitride based material and the side layers are made of silicon oxide. In one or more of the foregoing and following embodiments, side faces in the first direction of the separation wall are in contact with a gate dielectric layer of each of the first to fourth gate structures. In one or more of the foregoing and following embodiments, a bottom layer is provided under a bottom portion of the separation wall, and a material forming the bottom layer is the same as the material forming the side layers. In one or more of the foregoing and following embodiments, each of the first to fourth gate structures includes gate sidewall spacers, and the gate sidewall spacers are in contact with the separation wall. In one or more of the foregoing and following embodiments, the first to fourth gate structures are disposed on an upper surface of an isolation insulating layer, and a bottom of the separation wall is located below the upper surface of the isolation insulating layer. In one or more of the foregoing and following embodiments, the first gate structure has a first end and a second end in the first direction, the first end of the first gate structure is in contact with the separation wall, and the second end of the first gate structure is in contact with an interlayer dielectric layer different from the separation wall. In one or more of the foregoing and following embodiments, ends of the separation wall penetrate into the interlayer dielectric layer. In one or more of the foregoing and following embodiments, each of the first to fourth gate structures is disposed over two fin structures extending in the second direction.

In accordance with another aspect of the present disclosure, a semiconductor device includes a plurality of fin structures extending in a first direction and arranged in a second direction crossing the first direction, a plurality of gate structures extending in the second direction and arranged in the first direction, and a plurality of separation walls separating one pair of gate structures and another pair of gate structures. The plurality of separation walls are arranged in a staggered manner. In one or more of the foregoing and following embodiments, a pitch of plurality of the separation walls along a line extending in the second direction is twice a pitch of the plurality of fin structures. In one or more of the foregoing and following embodiments, each of the plurality of separation walls is in contact with the one pair of gate structures and the another pair of gate structures and is in contact with no gate structure other than one pair of gate structures and the another pair of gate structures. In one or more of the foregoing and following embodiments, the semiconductor device further includes an end separation wall having one side and another side, and the one side is in contact with a pair of gate structures and the another side is in contact with an interlayer dielectric layer.

In accordance with another aspect of the present disclosure, in a method for manufacturing a semiconductor device, a pair of sacrificial gate structures are formed over channel regions formed over a substrate. Each of the pair of sacrificial gate structures includes a sacrificial gate electrode layer, a sacrificial gate dielectric layer and sidewall spacer layers disposed on both sides of the sacrificial gate electrode layer. Interlayer dielectric layers are at both sides of the pair of sacrificial gate structures. The pair of sacrificial gate structures and the interlayer dielectric layer are patterned so that the pair of sacrificial gate structures are divided into at least a first sacrificial gate structure and a second sacrificial gate structure separated by a separation opening and a third sacrificial gate structure and a fourth sacrificial gate structure separated by the separation opening. A separation wall is formed by filling the separation opening with a first insulating material and a second insulating material different from the first insulating material. The sacrificial gate electrode layer and the sacrificial gate dielectric layer are removed from the first to fourth sacrificial gate structures, so that a first electrode space and a second electrode space are formed and the separation wall is exposed between the first electrode space and the second electrode space and a third electrode space and a fourth electrode space are formed and the separation wall is exposed between the third electrode space and the fourth electrode space. A first gate structure, a second gate structure, a third gate structure and a fourth gate structure are formed in the first electrode space, the second electrode space, the third electrode space and the fourth electrode space, respectively. During the removing the sacrificial gate dielectric layer, portions of the first insulating material exposed to the first to fourth electrode spaces are removed. In one or more of the foregoing and following embodiments, the sacrificial gate dielectric layer and the first insulating material are made of a same material. In one or more of the foregoing and following embodiments, a third insulating layer is formed over the pair of sacrificial gate structures before the patterning the pair of sacrificial gate structures. In one or more of the foregoing and following embodiments, fin structures are formed over the substrate, an isolation insulating layer is formed over the substrate so that upper portions of the fin structures are exposed from the isolation insulating layer, and the channel regions are included in the exposed upper portions of the fin structures. In one or more of the foregoing and following embodiments, in the patterning the pair of sacrificial gate structures, an upper surface of the isolation insulating layer is partially etched so that a bottom of the separation opening is located below the upper surface of the isolation insulating layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a pair of sacrificial gate structures over channel regions formed over a substrate, each of the pair of sacrificial gate structures including a sacrificial gate electrode layer, a sacrificial gate dielectric layer and sidewall spacer layers disposed on both sides of the sacrificial gate electrode layer;
    forming interlayer dielectric layers at both sides of the pair of sacrificial gate structures;
    patterning the pair of sacrificial gate structures and the interlayer dielectric layers so that the pair of sacrificial gate structures are divided into at least a first sacrificial gate structure and a second sacrificial gate structure separated by a separation opening and a third sacrificial gate structure and a fourth sacrificial gate structure separated by the separation opening;
    forming a separation wall by filling the separation opening with a first insulating material and a second insulating material different from the first insulating material, wherein a part of the second insulating material of the separation wall is in direct connection with the interlayer dielectric layers;
    removing the sacrificial gate electrode layer and the sacrificial gate dielectric layer from the first to fourth sacrificial gate structures, so that a first electrode space and a second electrode space are formed and the separation wall is exposed between the first electrode space and the second electrode space and a third electrode space and a fourth electrode space are formed and the separation wall is exposed between the third electrode space and the fourth electrode space; and
    forming a first gate structure, a second gate structure, a third gate structure and a fourth gate structure in the first electrode space, the second electrode space, the third electrode space and the fourth electrode space, respectively,
    wherein, during the removing the sacrificial gate dielectric layer, portions of the first insulating material exposed to the first to fourth electrode spaces are removed.

2. The method of claim 1, wherein the sacrificial gate dielectric layer and the first insulating material are made of a same material.

3. The method of claim 1, further comprising forming a third insulating layer over the pair of sacrificial gate structures before the patterning the pair of sacrificial gate structures.

4. The method of claim 1, further comprising:
forming fin structures over the substrate; and
forming an isolation insulating layer over the substrate so that upper portions of the fin structures are exposed from the isolation insulating layer,
wherein the channel regions are included in the exposed upper portions of the fin structures.

5. The method of claim 4, wherein in the patterning the pair of sacrificial gate structures, an upper surface of the isolation insulating layer is partially etched so that a bottom of the separation opening is located below the upper surface of the isolation insulating layer.

6. The method of claim 1, wherein the first insulating material is made of SiCN, SiON or SiOCN.

7. The method of claim 1, wherein the second insulating material of the separation wall is made of a silicon nitride based material and the first insulating material of the separation wall is made of silicon oxide.

8. The method of claim 1, wherein ends of the separation wall penetrate into the interlayer dielectric layers.

9. The method of claim 1, wherein:
the pair of sacrificial gate structures are formed on an upper surface of an isolation insulating layer, and
in the patterning the pair of sacrificial gate structures and the interlayer dielectric layers, a part of the isolation insulating layer is etched in the separation opening.

10. The method of claim 9, wherein the upper surface of the isolation insulating layer in the separation opening is uneven.

11. The method of claim 1, wherein the separation wall divides an interlayer dielectric layer of the interlayer dielectric layers between the pair of sacrificial gate structures.

12. A method for manufacturing a semiconductor device, comprising:
forming a pair of sacrificial gate structures over an isolation insulating layer formed over a substrate, each of the pair of sacrificial gate structures including a sacrificial gate electrode layer, a sacrificial gate dielectric layer and sidewall spacer layers disposed on both sides of the sacrificial gate electrode layer;
forming interlayer dielectric layers at both sides of the pair of sacrificial gate structures;
patterning the pair of sacrificial gate structures and the interlayer dielectric layers so that the pair of sacrificial gate structures are divided into a first sacrificial gate structure and a second sacrificial gate structure separated by a separation opening and a third sacrificial gate structure and a fourth sacrificial gate structure separated by the separation opening;
forming a separation wall by filling the separation opening with a first insulating material and a second insulating material different from the first insulating material, wherein a part of the second insulating material of the separation wall is in direct connection with the interlayer dielectric layers;
removing the sacrificial gate electrode layer and the sacrificial gate dielectric layer from the first to fourth sacrificial gate structures, so that a first electrode space and a second electrode space are formed and the separation wall is exposed between the first electrode space and the second electrode space and a third electrode space and a fourth electrode space are formed and the separation wall is exposed between the third electrode space and the fourth electrode space; and
forming a first gate structure, a second gate structure, a third gate structure and a fourth gate structure in the first electrode space, the second electrode space, the third electrode space and the fourth electrode space, respectively,
wherein, during the removing the sacrificial gate dielectric layer, portions of the first insulating material exposed to the first to fourth electrode spaces are removed.

13. The method of claim 12, wherein in the patterning the pair of sacrificial gate structures and the interlayer dielectric layer, a part of the isolation insulating layer is etched in the separation opening.

14. The method of claim 13, wherein an upper surface of the isolation insulating layer in the separation opening is uneven.

15. The method of claim 14, wherein the upper surface of the isolation insulating layer includes protrusions at locations corresponding to the pair of sacrificial gate structures.

16. The method of claim 14, wherein the upper surface of the isolation insulating layer includes recesses at locations corresponding to the pair of sacrificial gate structures.

17. The method of claim 14, wherein the unevenness of the upper surface of the isolation insulating layer is in a range from 5 nm to 20 nm.

18. A method for manufacturing a semiconductor device, comprising:
forming sacrificial gate structures over an isolation insulating layer formed over a substrate, each of the sacrificial gate structures including a sacrificial gate electrode layer, a sacrificial gate dielectric layer and sidewall spacer layers disposed on both sides of the sacrificial gate electrode layer;
forming interlayer dielectric layers at both sides of the sacrificial gate structures;
patterning the sacrificial gate structures and the interlayer dielectric layers so that sacrificial gate structures are divided into pieces of sacrificial gate structure separated by separation openings, each of the separation openings separates two pairs of the sacrificial gate structures; and
forming separation walls by filling the separation openings with a first insulating material and a second insulating material different from the first insulating material,
wherein the separation walls are arranged in a staggered manner.

19. The method of claim 18, further comprising:
removing the sacrificial gate electrode layer and the sacrificial gate dielectric layer from the pieces of sacrificial gate structures, thereby forming gate spaces; and
forming gate structures in the gate spaces, respectively,
wherein, during the removing the sacrificial gate dielectric layer, portions of the first insulating material exposed to the gate spaces are removed.

20. The method of claim 18, wherein:
the sacrificial gate structures are disposed over fin structures, and
a pitch of the separation walls is twice a pitch of the fin structures.

* * * * *